United States Patent
Huang et al.

(10) Patent No.: US 9,676,906 B1
(45) Date of Patent: Jun. 13, 2017

(54) POLYMER OF POLY(ARYLENE ETHER)S, MANUFACTURING METHOD THEREOF AND POLYMER LIGHT EMITTING DIODE WITH ORGANIC LIGHT EMITTING LAYER MADE FROM THE SAME

(71) Applicants: National Sun Yat-sen University, Kaohsiung (TW); Wah Hong Industrial Corp., Kaohsiung (TW)

(72) Inventors: Wen-yao Huang, Kaohsiung (TW); Hsu-feng Lee, Kaohsiung (TW); Yi-chiang Huang, Kaohsiung (TW); Mei-ying Chang, Kaohsiung (TW); Tzu-sheng Huang, Kaohsiung (TW); Hsin-yi Wen, Kaohsiung (TW); Chih-chen Wu, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 15/077,928

(22) Filed: Mar. 23, 2016

(30) Foreign Application Priority Data

Jan. 7, 2016 (TW) .............................. 105100385 A

(51) Int. Cl.
| | |
|---|---|
| *C08G 8/02* | (2006.01) |
| *C08G 65/40* | (2006.01) |
| *H01L 51/00* | (2006.01) |
| *C09K 11/06* | (2006.01) |
| *C09D 5/22* | (2006.01) |
| *C09D 171/00* | (2006.01) |
| *H01L 51/50* | (2006.01) |
| *H01L 51/56* | (2006.01) |

(52) U.S. Cl.
CPC .......... *C08G 65/40* (2013.01); *C08G 65/4093* (2013.01); *C09D 5/22* (2013.01); *C09D 171/00* (2013.01); *C09K 11/06* (2013.01); *H01L 51/0035* (2013.01); *C08G 2650/48* (2013.01); *C09K 2211/1416* (2013.01); *C09K 2211/1425* (2013.01); *H01L 51/0007* (2013.01); *H01L 51/5012* (2013.01); *H01L 51/56* (2013.01)

(58) Field of Classification Search
CPC .......... C08G 18/0828; C08G 2261/516; C08G 2261/1452; C08G 2261/722; H01B 1/122; H01M 8/1025
USPC .......................................... 528/125, 373, 370
See application file for complete search history.

(56) References Cited

U.S. PATENT DOCUMENTS

| | | | |
|---|---|---|---|
| 8,987,407 B2 | 3/2015 | Huang et al. | |
| 9,209,472 B2 | 12/2015 | Huang et al. | |

FOREIGN PATENT DOCUMENTS

| | | |
|---|---|---|
| TW | 572922 B | 1/2004 |
| TW | 201339201 A | 10/2013 |
| TW | 201504286 A | 2/2015 |
| TW | 201505244 A | 2/2015 |
| TW | I527842 B | 4/2016 |

OTHER PUBLICATIONS

Hwang et al. (Macromolecules, vol. 34, No. 9, 2001).*
Synthesis of poly(arylene ether)s containing 9,9'-spirobifluorene and applications in polymer light-emitting diodes Jul. 2015.

* cited by examiner

*Primary Examiner* — Shane Fang
(74) *Attorney, Agent, or Firm* — Mark M. Friedman

(57) ABSTRACT

A polymer of poly(arylene ether)s, a manufacturing method thereof, and a polymer light emitting diode with an organic light emitting layer made from the polymer are provided. The polymer is formed by processing a nucleophilic polycondensation between a fluoro-containing monomer having an electron-withdrawing group and a multi-phenyl monomer. The polymer has a host portion with fluoro- or trifluoromethyl substituents, and a customer portion with multi-phenyl groups.

4 Claims, No Drawings

POLYMER OF POLY(ARYLENE ETHER)S, MANUFACTURING METHOD THEREOF AND POLYMER LIGHT EMITTING DIODE WITH ORGANIC LIGHT EMITTING LAYER MADE FROM THE SAME

CROSS REFERENCE TO RELATED APPLICATIONS

This application claims the benefit of priority of Taiwan Patent Application No. 105100385, filed on Jan. 7, 2016, the disclosure of which is incorporated herein by reference. This invention is partly disclosed in a thesis entitled "Synthesis of poly(arylene ether)s containing 9,9'-spirobifluorene and applications in polymer light-emitting diodes" on Jul. 9, 2015 completed by Tzu-Sheng Huang and Mei-Ying Chang.

FIELD OF THE INVENTION

The present invention relates to a polymer of poly(arylene ether)s, a manufacturing method thereof, and a polymer light emitting diode, and in particular relates to a polymer of poly(arylene ether)s having a polycyclic aromatic hydrocarbons with fluorine-containing substituents as a subject portion, a manufacturing method thereof, and a polymer light emitting diode having an organic light emitting layer made from the polymer of poly(arylene ether)s.

BACKGROUND OF THE INVENTION

Basic principles of organic electroluminescent (OEL) is to dispose an organic light emitting layer between two electrode layers, so that the organic light emitting layer can emit light after the electrodes are electrified. An element using organic electroluminescent is called an organic light emitting diode (OLED). However, since the light emitting layer is made from organic materials, and the electrodes are generally made from inorganic materials, the interfacial combination between the light emitting layer and the electrodes is poor. Thus, some buffer layers are disposed between the organic layer and the inorganic layer to enhance the electroluminescent efficiency.

Currently, in accordance with the difference of light emitting materials, the OLEDs can be classified into small-molecule light emitting diodes (OLDE) and polymer light emitting diodes (PLED). Most OLEDs are formed by using vacuum evaporation deposition, and many vacuum devices are needed for preventing cross-contamination between the material layers because OLEDs have a complex structure. The organic polymer can form a thin film by solution coating due to its good film-forming ability, and the process can be carried out in general atmosphere. Therefore, considering equipment and process costs, the PLED formed by the organic polymers has much lower costs. In addition, since the manufacturing process is simple and convenient, it can be applied to roller printing and screen printing. The PLED is more conducive than the OLED to a large-size plane development.

Current polymer light emitting materials all belong to conjugate conductive polymers, the problems of the conjugate conductive polymers are that: (1) the polymerization is carried out by using expensive catalysts; (2) the emitting properties are poor; (3) the materials are not flexible after being coated or plated to form a thin film on a flexible substrate; and (4) the color purity is poor.

It is therefore necessary to provide a polymer of poly(arylene ether)s, a manufacturing method thereof, and a polymer light emitting diode, in order to solve the problems existing in the conventional technology as described above.

SUMMARY OF THE INVENTION

A primary object of the present invention is to provide a polymer of poly(arylene ether)s which is a polymer light emitting material suitable for a wet coating process to produce an organic electroluminescent element. The polymer of poly(arylene ether)s has a subject portion and an object portion connected with each other by ether bonds, and the subject portion has an energy gap higher than that of the object portion thereby an energy is absorbed by the subject portion and transferred to the object portion when the polymer of poly(arylene ether)s is excited by an provided energy to allow the object portion output an irradiation. The subject portion of the polymer of poly(arylene ether)s is formed by a fluorine-containing monomer which contains electron-withdrawing groups, and the object portion is formed by a multi-phenyl monomer. The fluorine-containing monomer and the multi-phenyl monomer forms the ether bonds through a nucleophilic polycondensation, and the weight average molecular weight Mw of the polymer of poly(arylene ether)s is between 2,000 and 1,000,000. The blue light coordinate of the polymer of poly(arylene ether)s is similar with that of the official regulation and belongs to a deep blue light material, having a good color purity. The polymer of poly(arylene ether)s has superior emitting properties like small molecules and easy processing properties like polymers.

A secondary object of the present invention is to provide a manufacturing method of a polymer of poly(arylene ether)s. A catalyst is not necessary in the manufacturing method which comprises a polymerization capable of being carried out under a small amount of a weak base. Therefore, the reaction condition is simple to lower costs efficiently, and the remaining catalyst is reduced to improve the lifetime of light emitting elements. In addition, when the polymer of poly(arylene ether)s is used to produce an organic light emitting layer, a good thin film can be formed by a wet coating process that is helpful to simplify process and reduce process costs, and conducive to the production of large-size components.

A further object of the present invention is to provide a polymer light emitting diode having an organic light emitting layer by using the abovementioned polymer of poly(arylene ether)s as a material. The polymer light emitting diode has advantages of low costs, simple procedure, and excellent color purity.

To achieve the above objects, the present invention provides a polymer of poly(arylene ether)s, having a molecular structure given in the following formula (1):

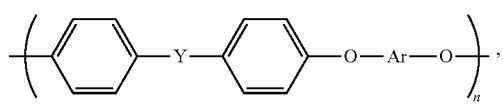
(1)
wherein Ar is selected from the group consisting of
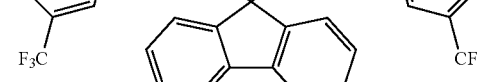
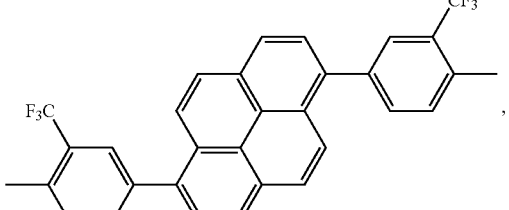
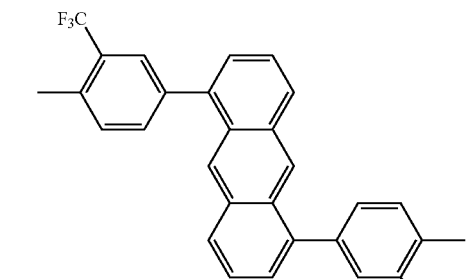
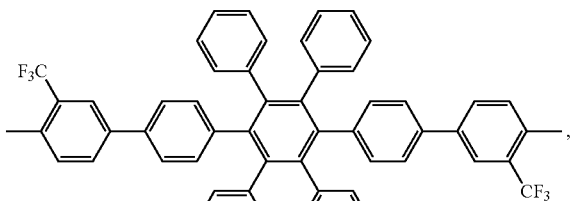
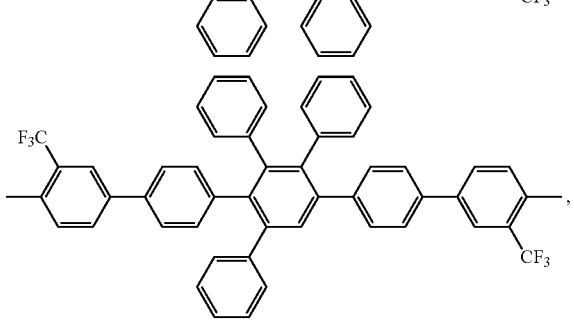
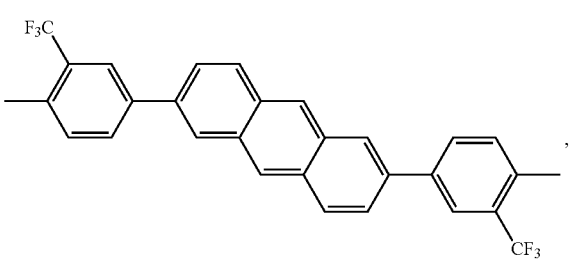
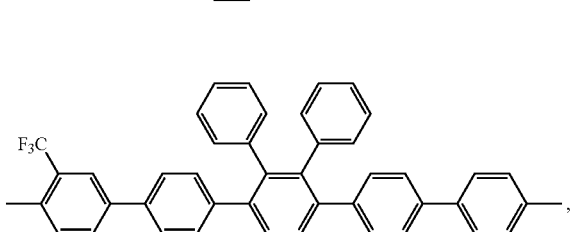
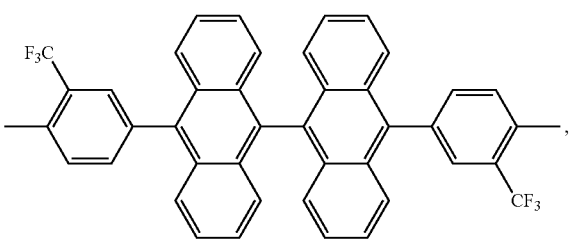
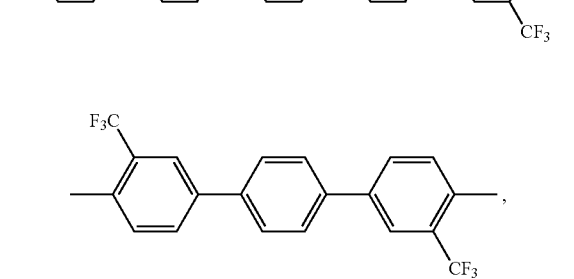
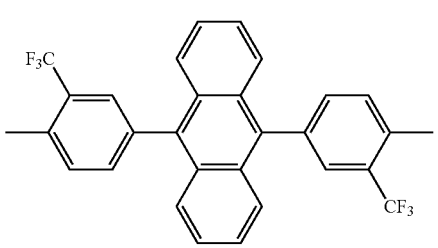

-continued
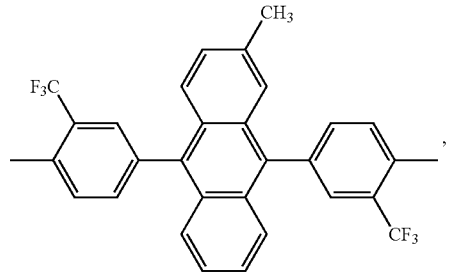
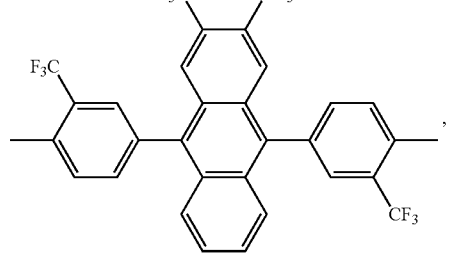
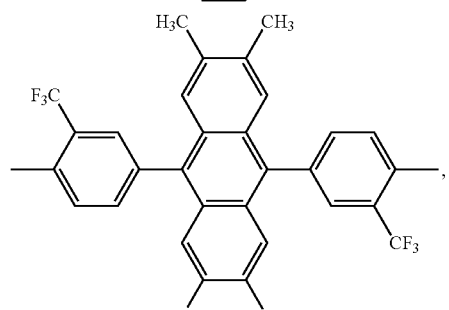
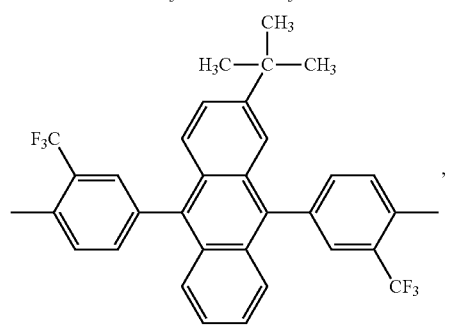
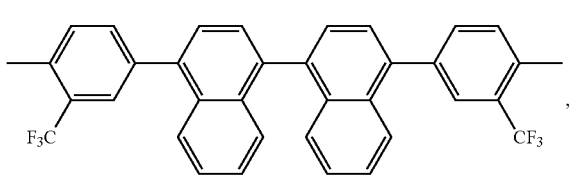
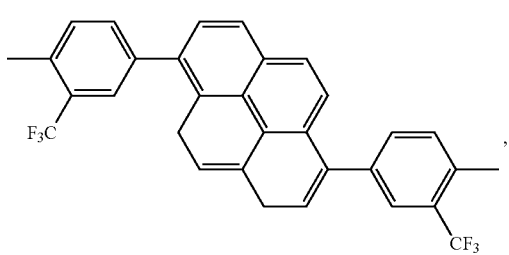
-continued
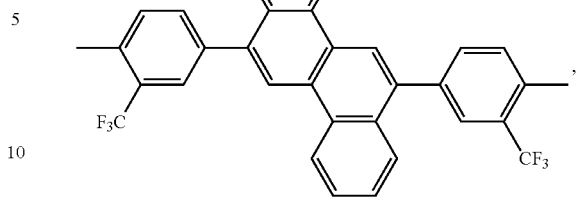
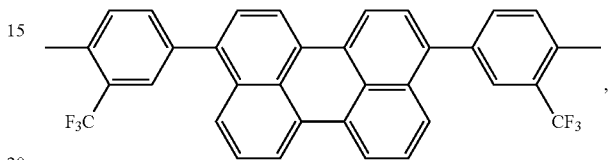
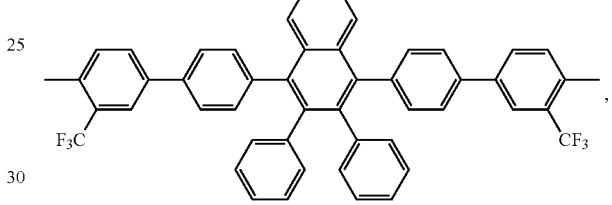
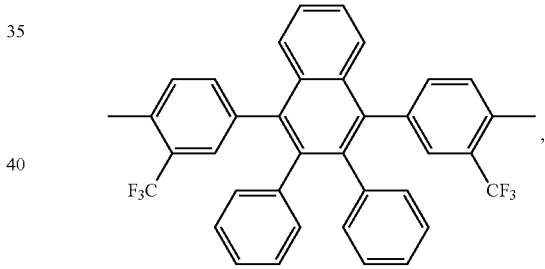
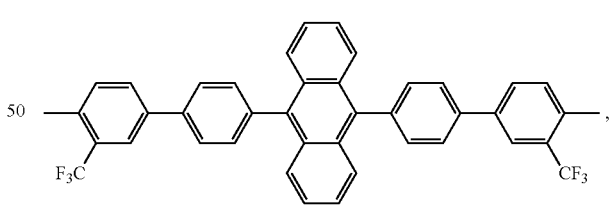
and
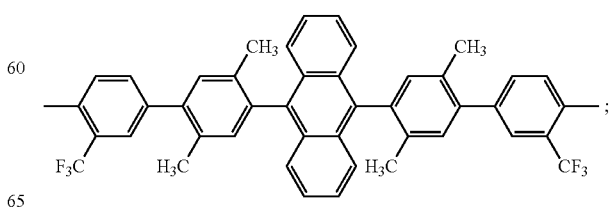

Y is selected from the group consisting of
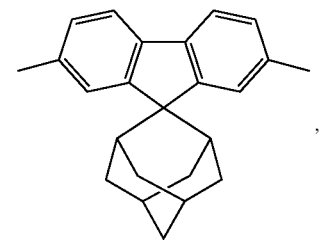,
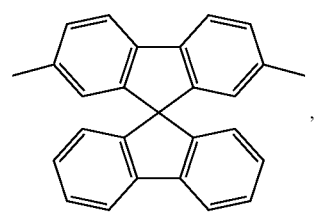,
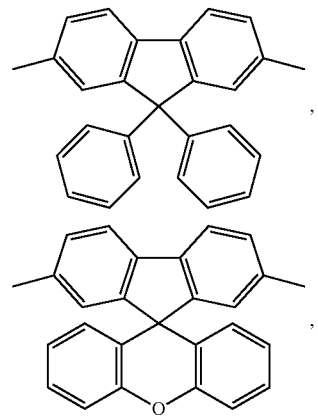,
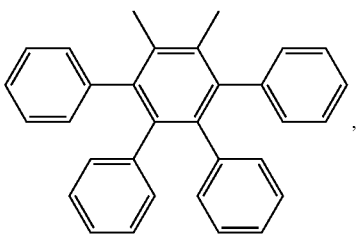,
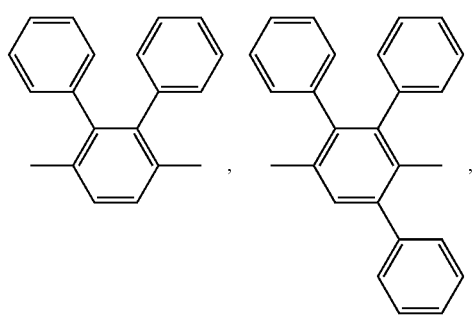,
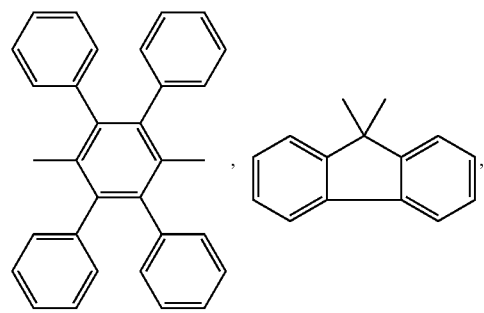,
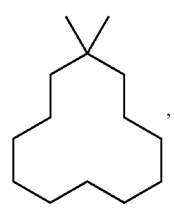,
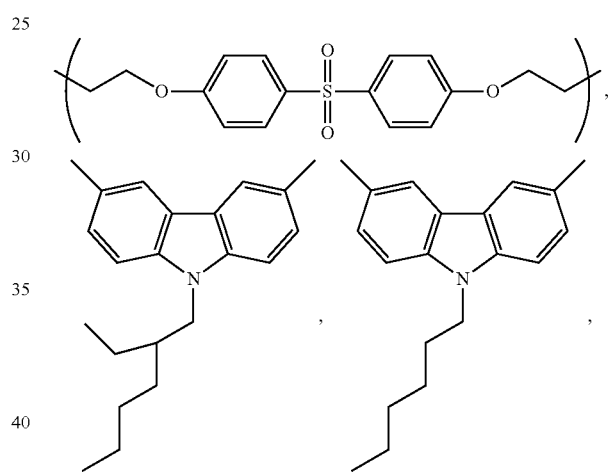,
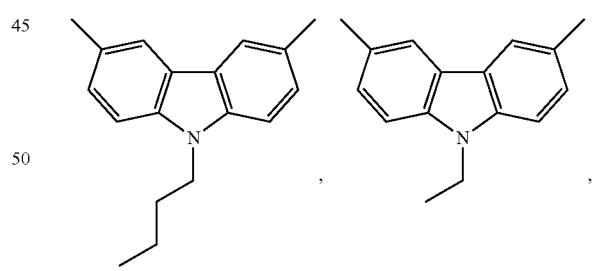,
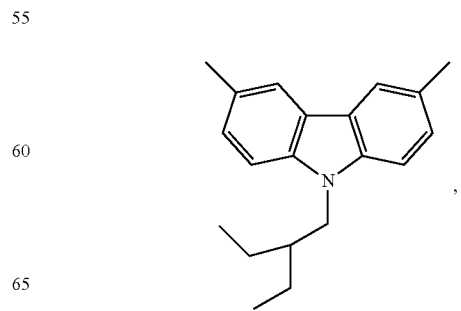,

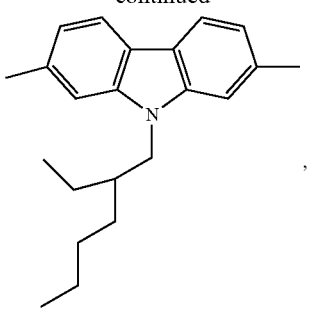
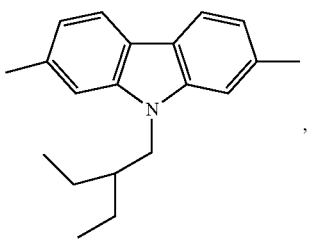
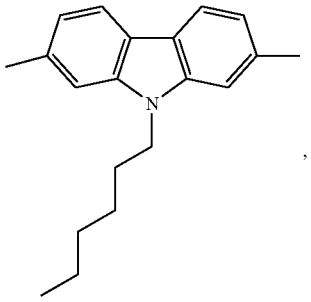
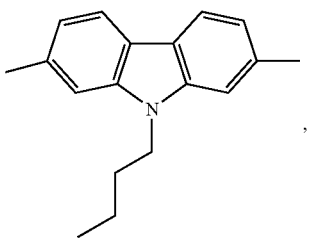
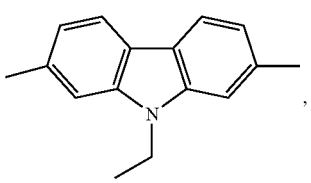
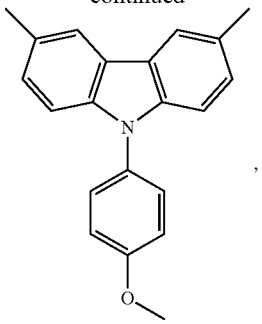,
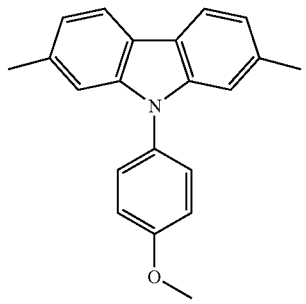, and
;
and n is an integer greater than or equal to 2.
In one embodiment of the present invention, the polymer of poly(arylene ether)s is
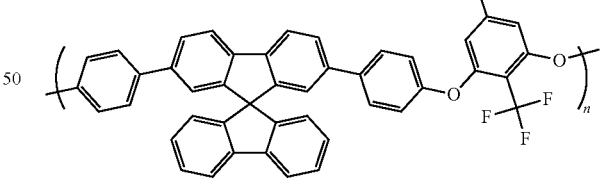
or
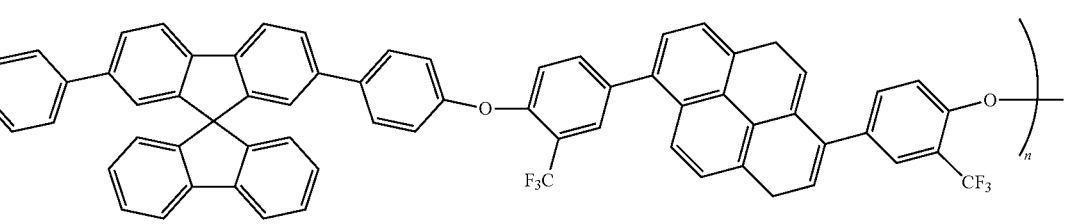

In one embodiment of the present invention, the polymer of poly(arylene ether)s is coated to form a thin film used as an organic light emitting layer, and applied to a polymer light emitting diode.

Furthermore, another embodiment of the present invention is to provide a manufacturing method of a polymer of poly(arylene ether)s, comprising steps of: (S01) providing a fluorine-containing monomer having a molecular structure given in the following formula (I):

D1-Ar-D1          (I), wherein Ar is selected from the group consisting of

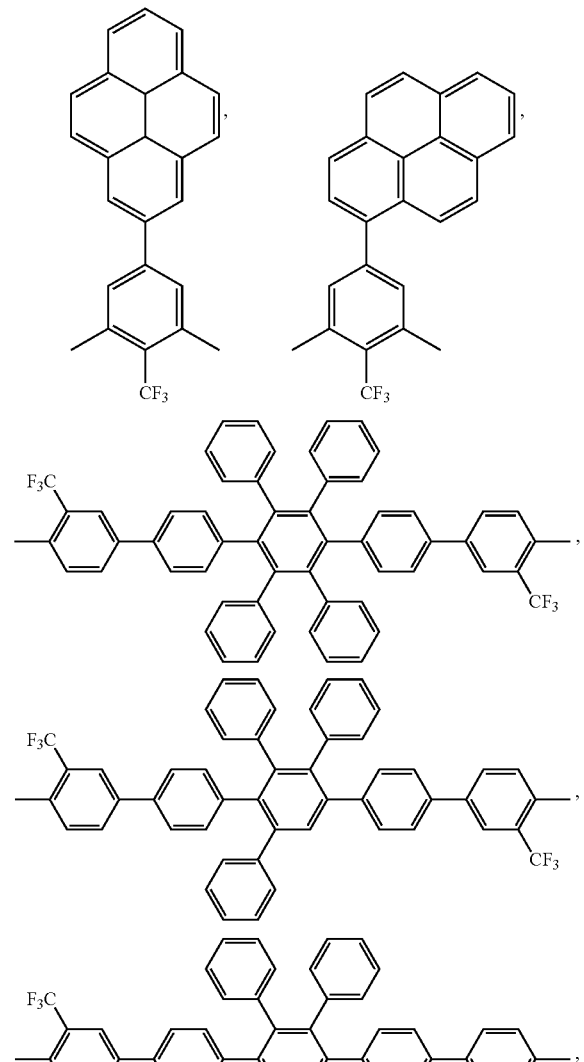

-continued

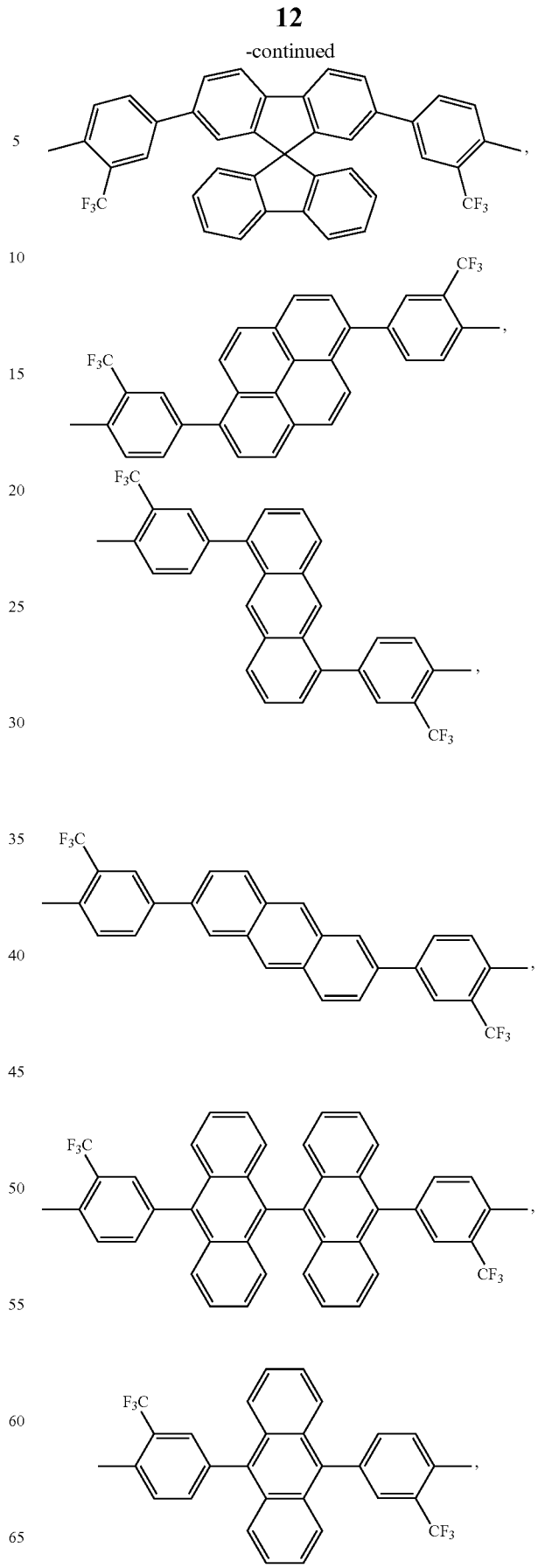

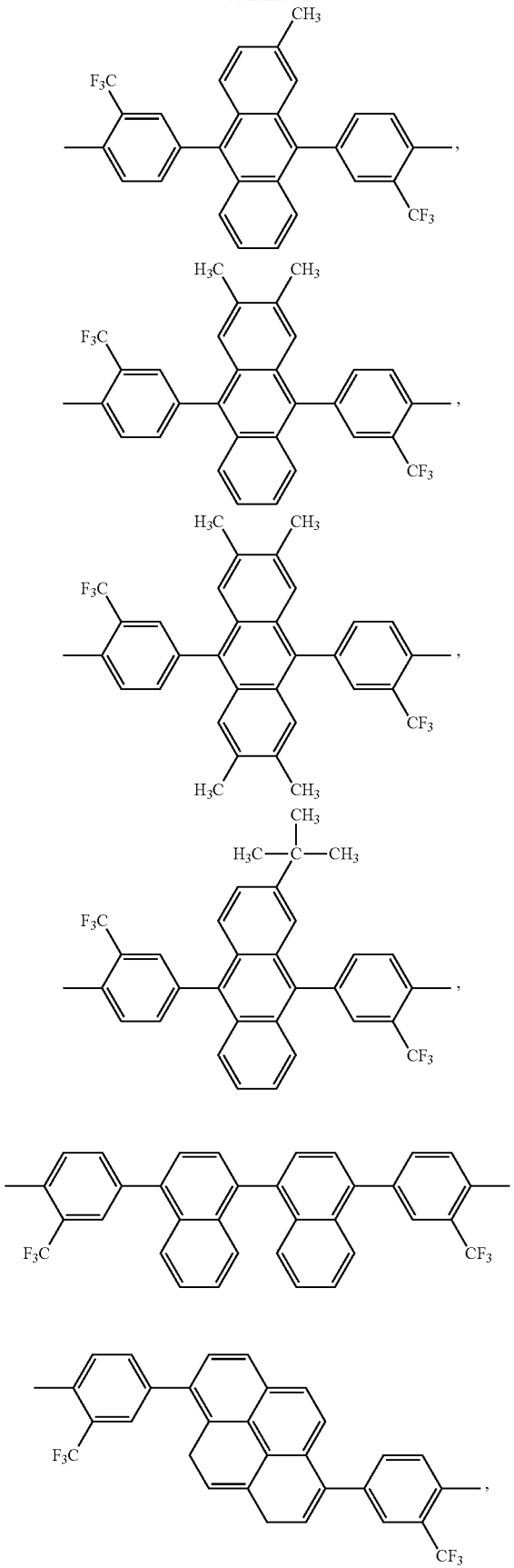
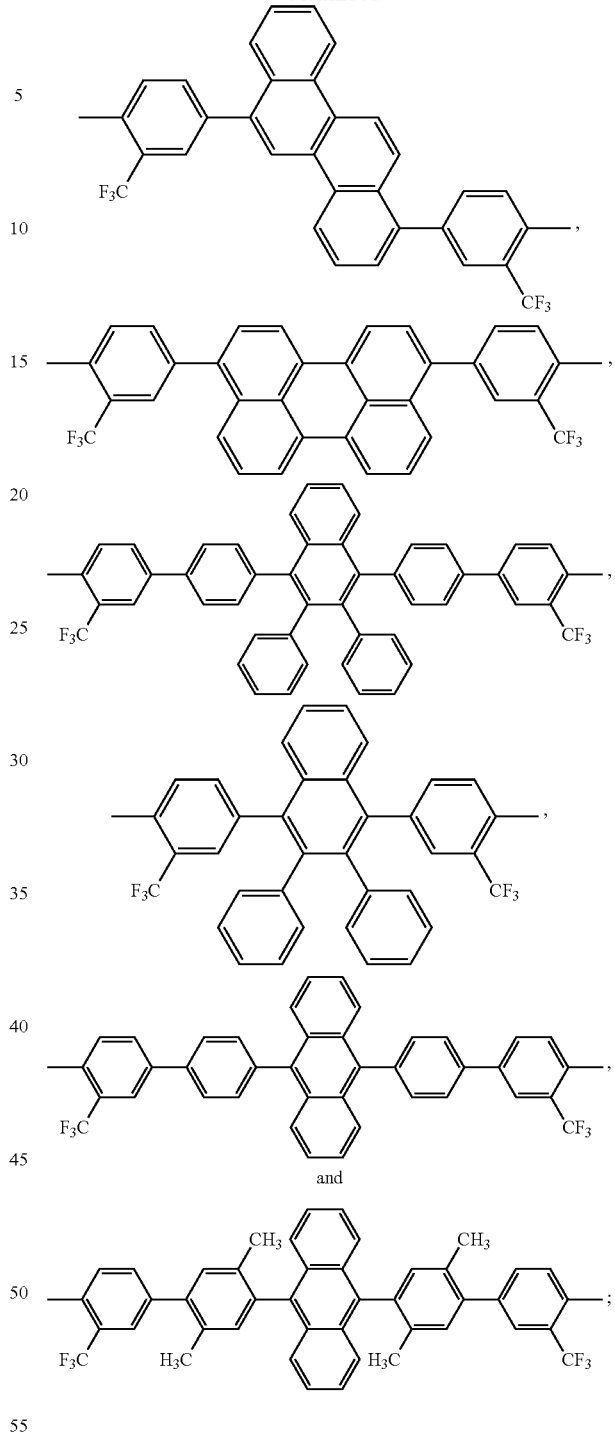
and D1 is halogen or hydroxyl group;
(S02) providing a multi-phenyl monomer having a molecular structure given in the following formula (II):
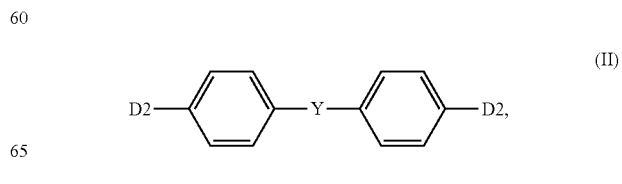

wherein Y is selected from the group consisting of
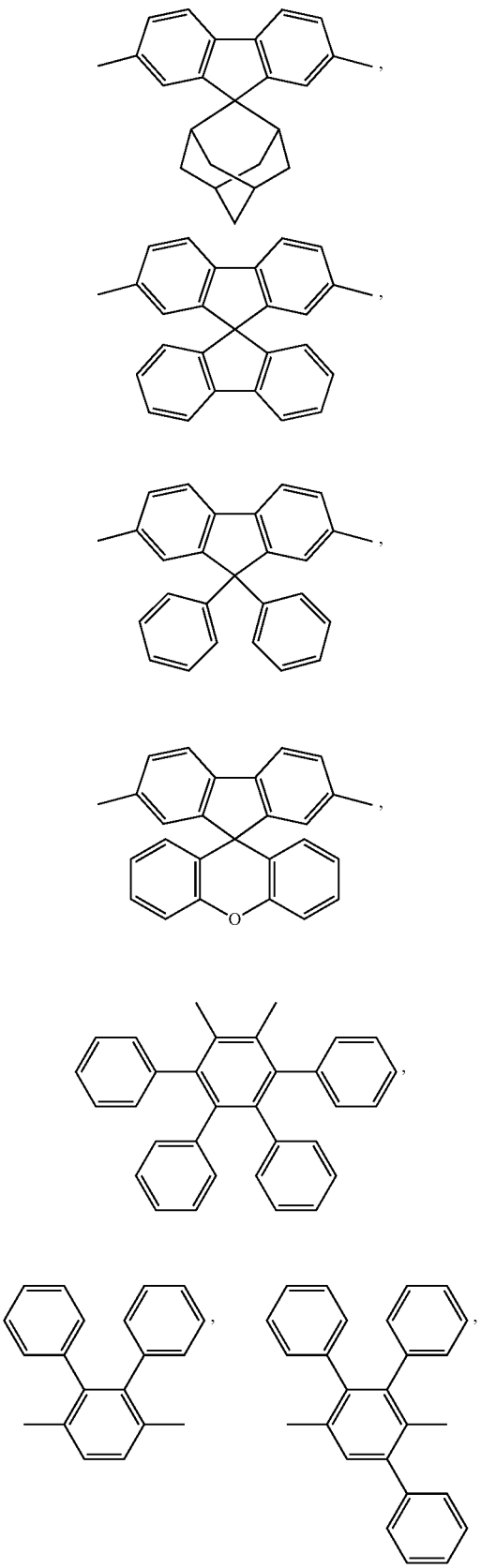
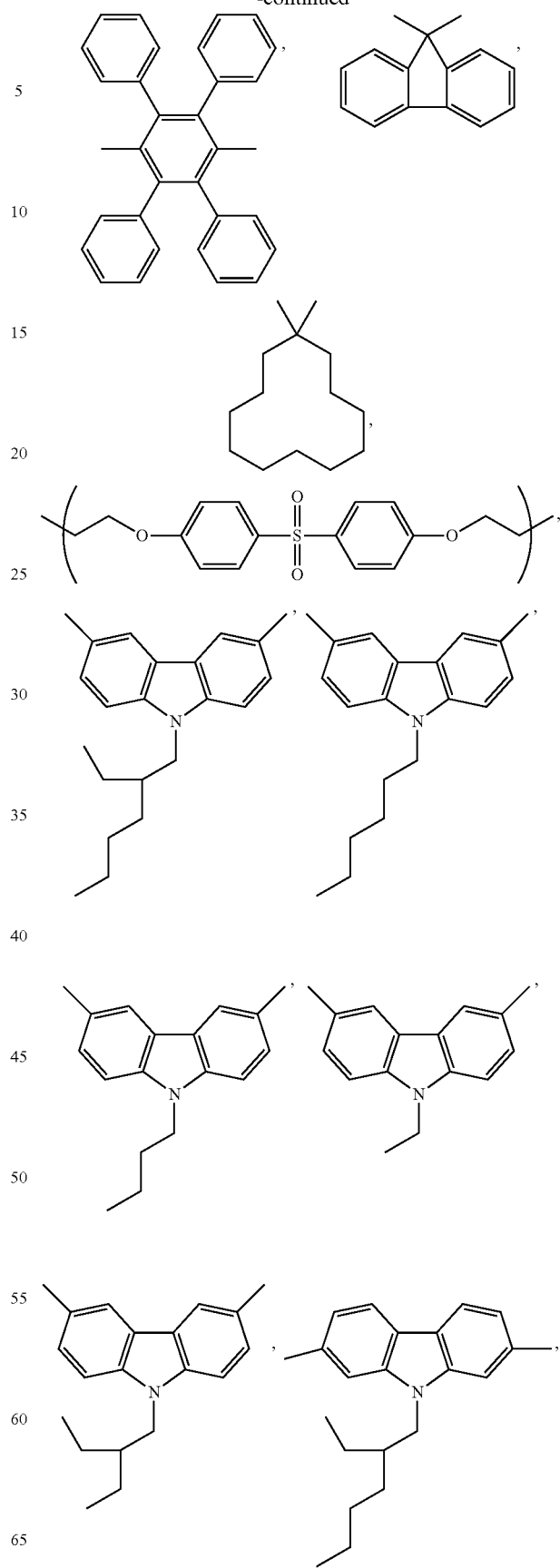

-continued

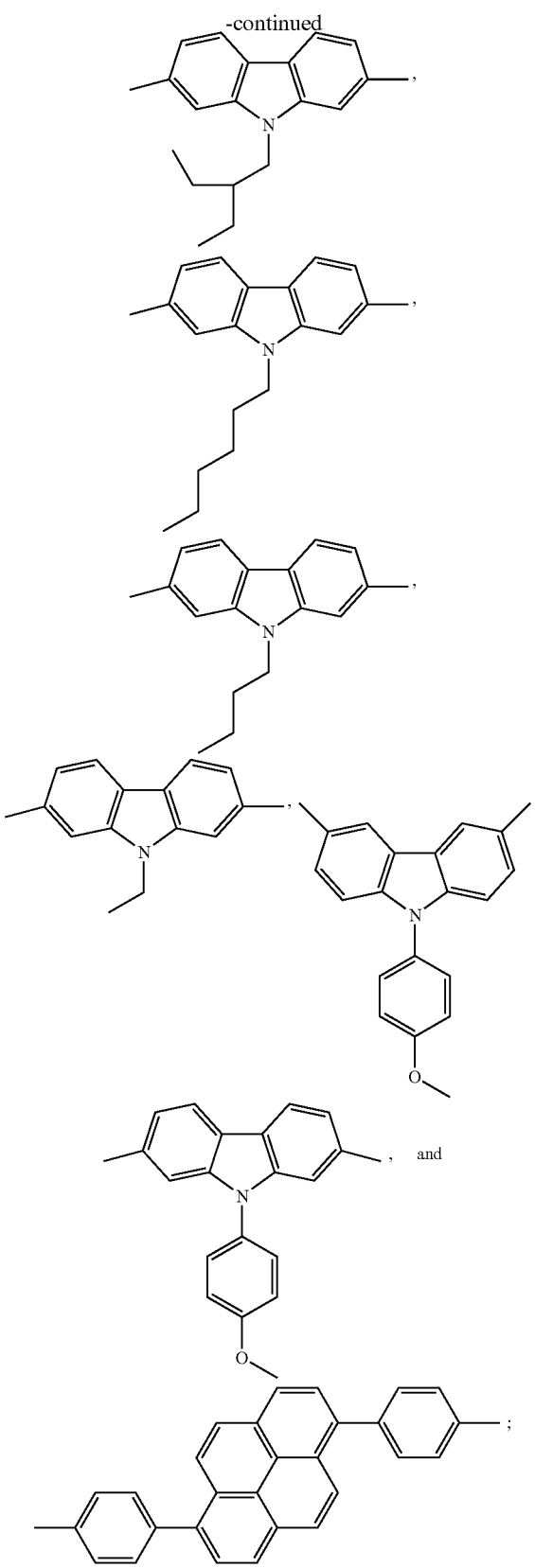

D2 is halogen or hydroxyl group; and D2 is the hydroxyl group if D1 is the halogen group, or D2 is the halogen group if D1 is the hydroxyl group; and (S03) processing a nucleo- philic polycondensation between the fluorine-containing monomer and the multi-phenyl monomer to form the above-mentioned polymer of poly(arylene ether)s.

In one embodiment of the present invention, the fluorine-containing monomer in the step (S01) is

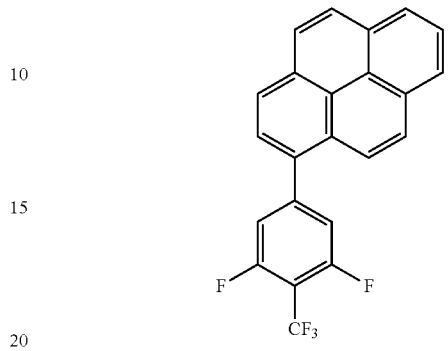

or

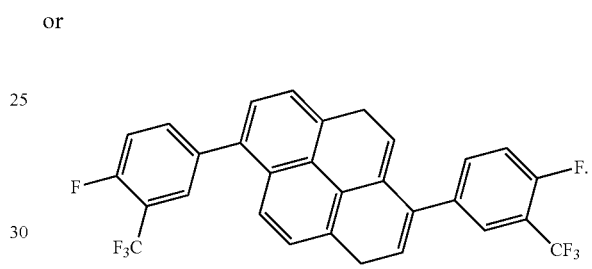

In one embodiment of the present invention, the multi-phenyl monomer in the step (S02) is

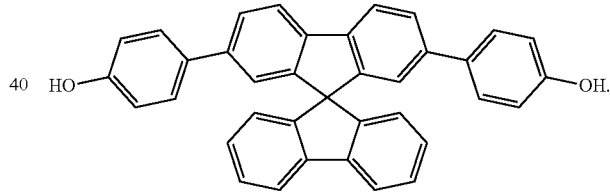

In one embodiment of the present invention, after the step (S03), the manufacturing method further comprises a step (S04) of: dissolving the polymer of poly(arylene ether)s in an organic solvent, and forming a thin film by coating.

In one embodiment of the present invention, the thin film is used as an organic light emitting layer, and applied to a polymer light emitting diode.

A further embodiment of the present invention is to provide polymer light emitting diode, comprising an organic light emitting layer containing the abovementioned polymer of poly(arylene ether)s.

DETAILED DESCRIPTION OF THE PREFERRED EMBODIMENTS

The structure and the technical means adopted by the present invention to achieve the above and other objects can be best understood by referring to the following detailed description of the preferred embodiments. Furthermore, if there is no specific description in the invention, singular terms such as "a", "one", and "the" include the plural number. For example, "a compound" or "at least one compound" may include a plurality of compounds, and the mixtures thereof. If there is no specific description in the invention, "%" means "weight percentage (wt %)", and the numerical range (e.g. 10%~11% of A) contains the upper and lower limit (i.e. 10%≤A≤11%). If the lower limit is not defined in the range (e.g. less than, or below 0.2% of B), it means that the lower limit is 0 (i.e. 0%≤B≤0.2%). The proportion of "weight percent" of each component can be replaced by the proportion of "weight portion" thereof. The abovementioned terms are used to describe and understand the present invention, but the present invention is not limited thereto.

The present invention provides a polymer of poly(arylene ether)s and a method of manufacturing the same. The polymer of poly(arylene ether)s is suitable for use as a functional polymer film, and in particular for use as an organic light emitting layer in a polymer light emitting diode.

In one embodiment of the present invention, the polymer of poly(arylene ether)s has the molecular formula given in the following formula

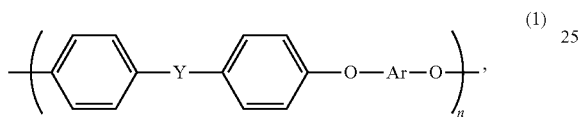

wherein Ar is

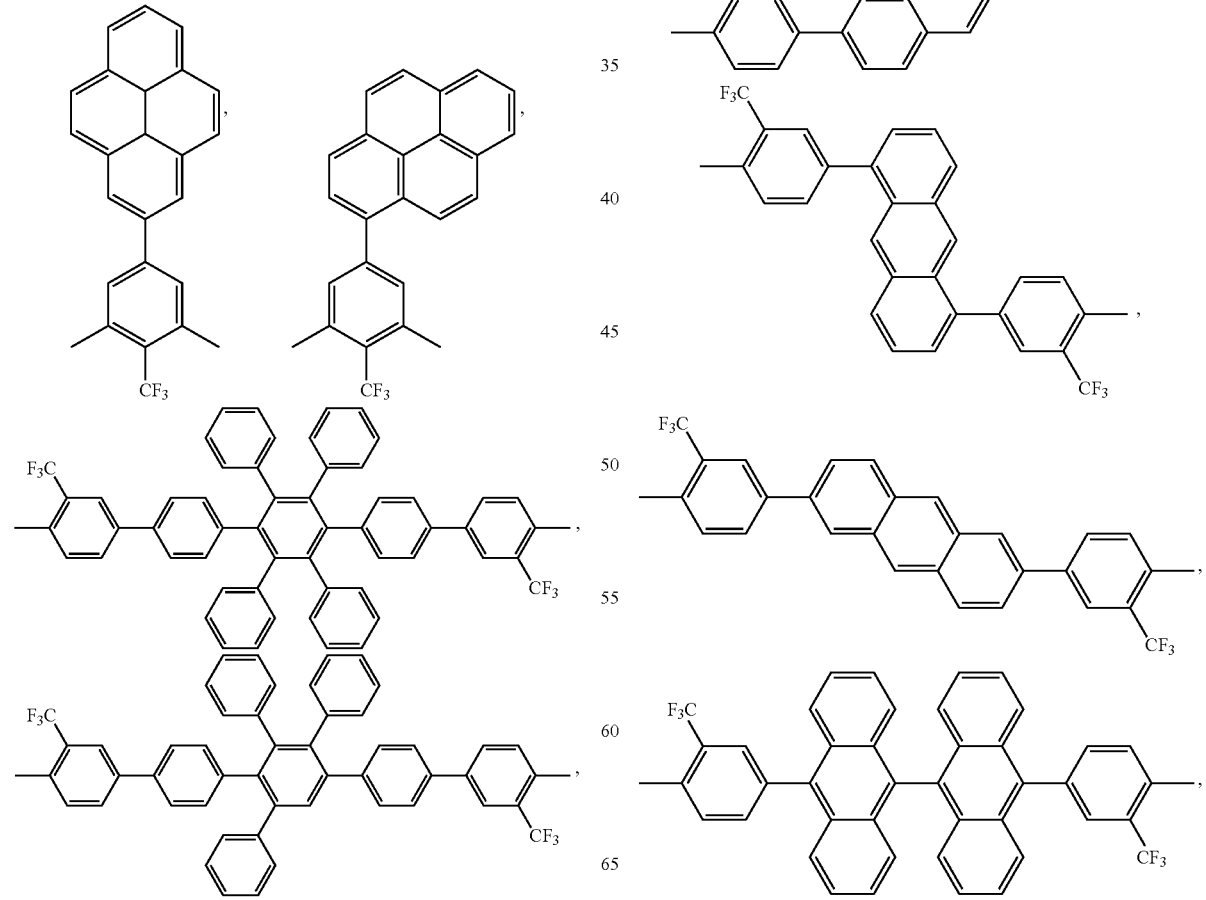

-continued
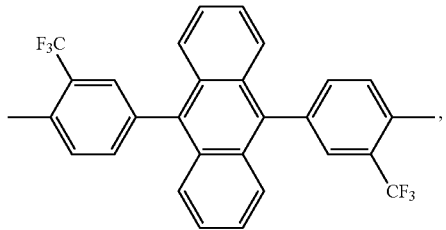
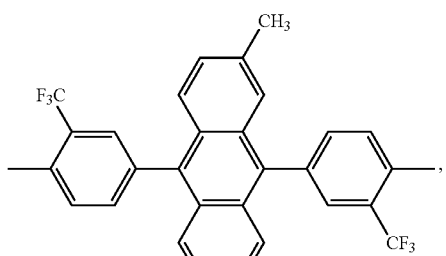
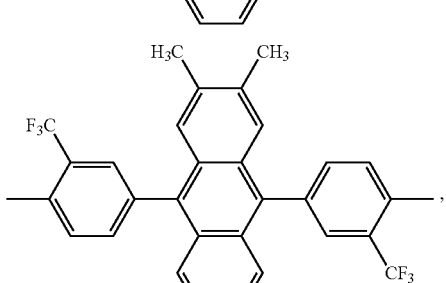
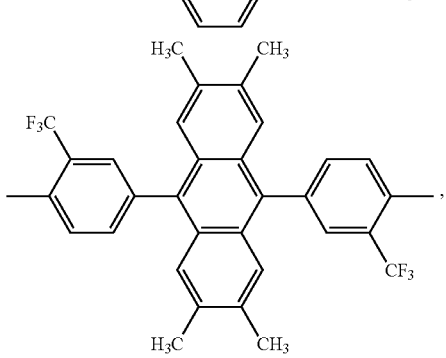
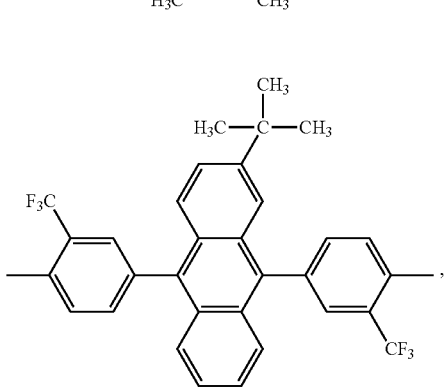
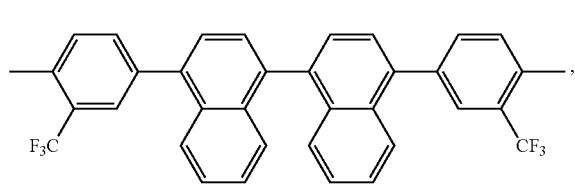
-continued
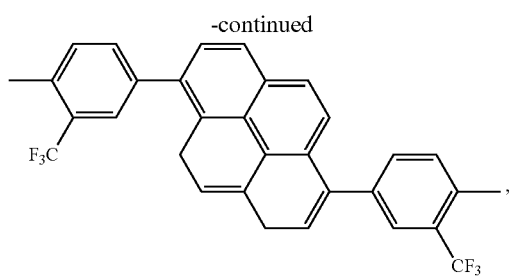
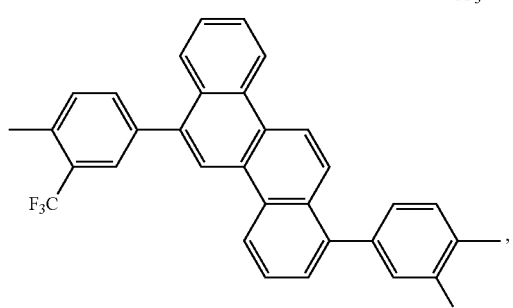
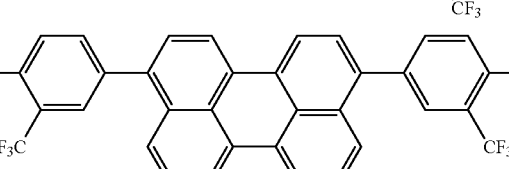
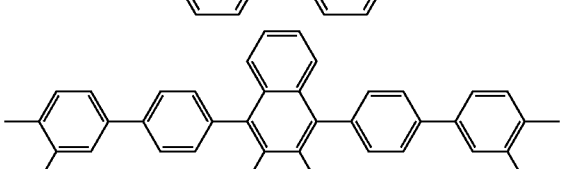
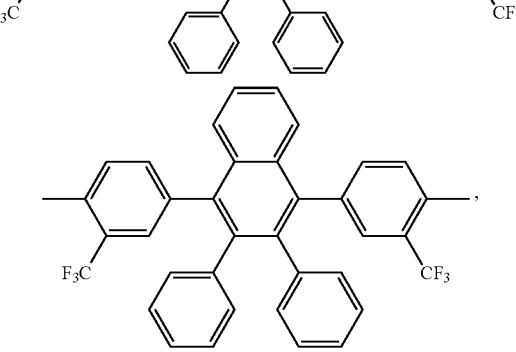
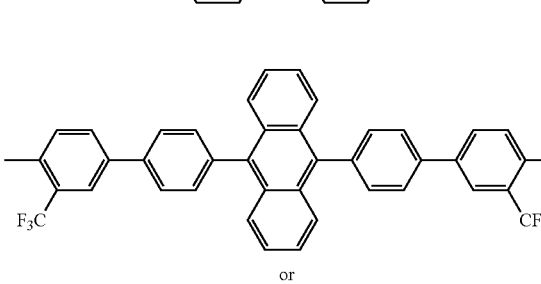
or
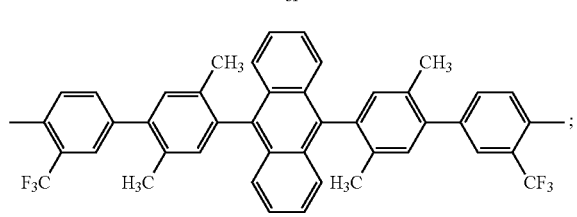;

Y is
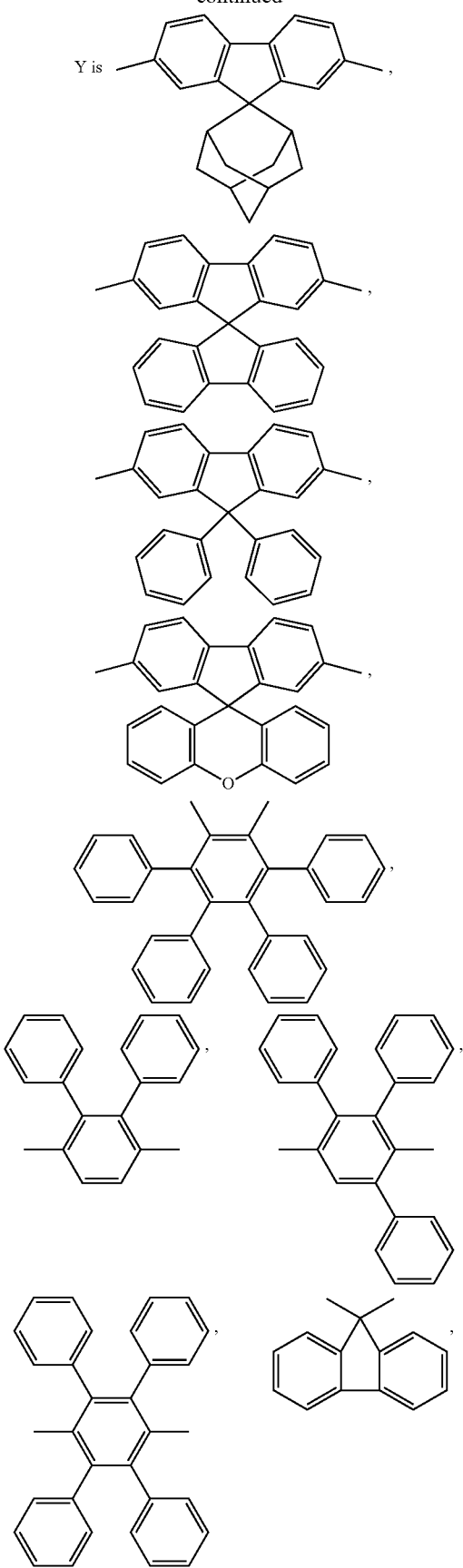
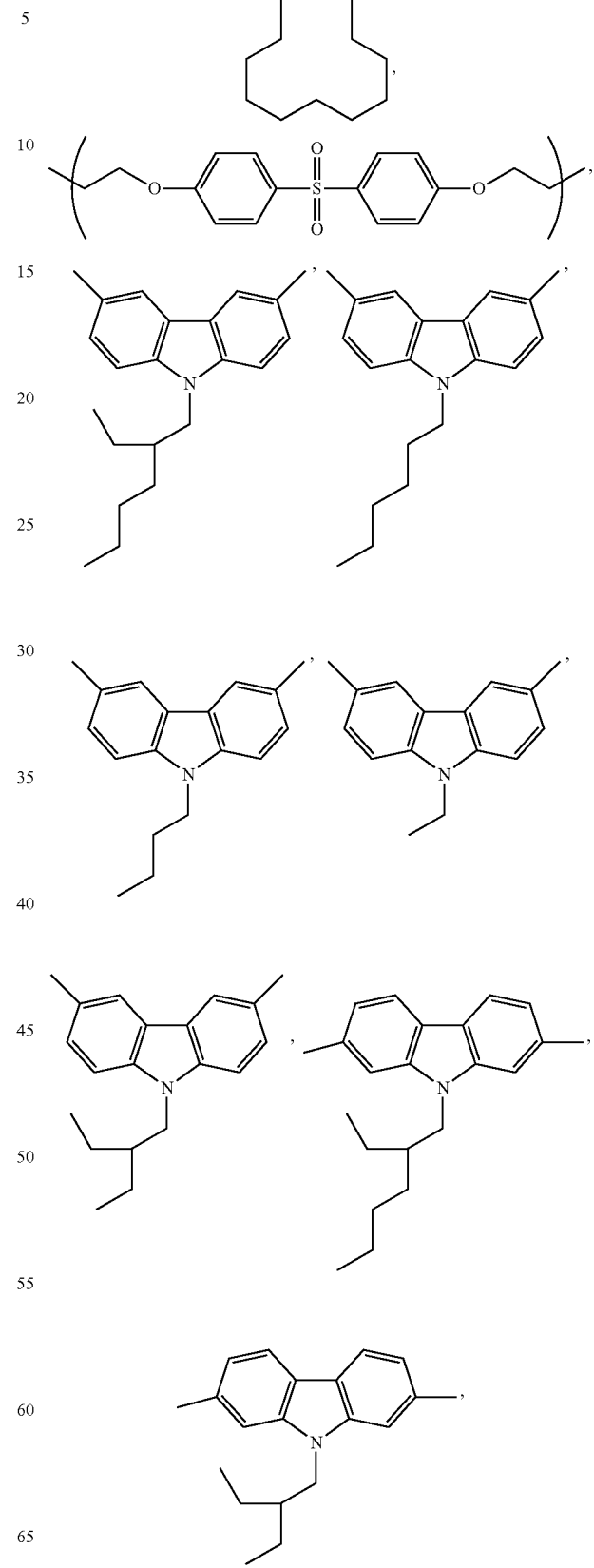

25
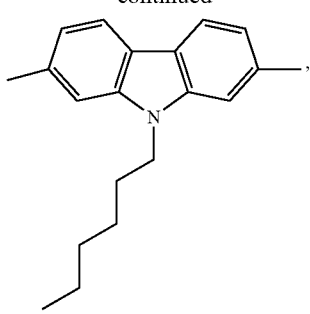
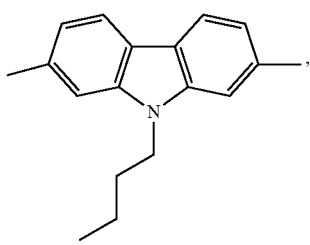
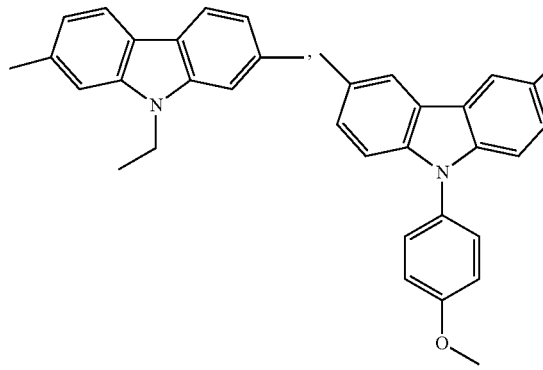
26
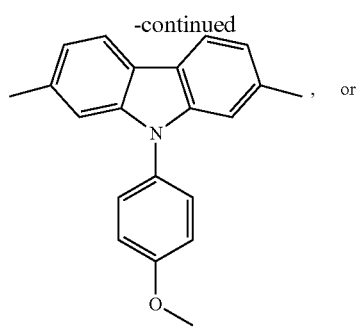, or
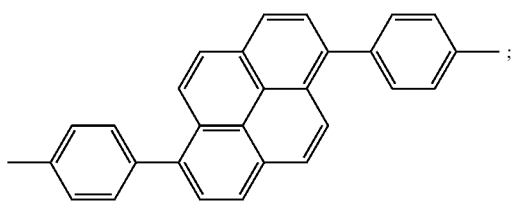;
and n is an integer greater than or equal to 2. The polymer of poly(arylene ether)s mainly includes a subject portion and an object portion, the subject portion is connected with the object portion by an ether bond. Preferably, the polymer of poly(arylene ether)s is
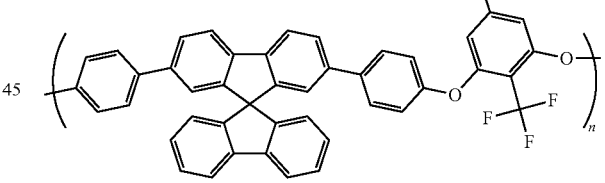
or
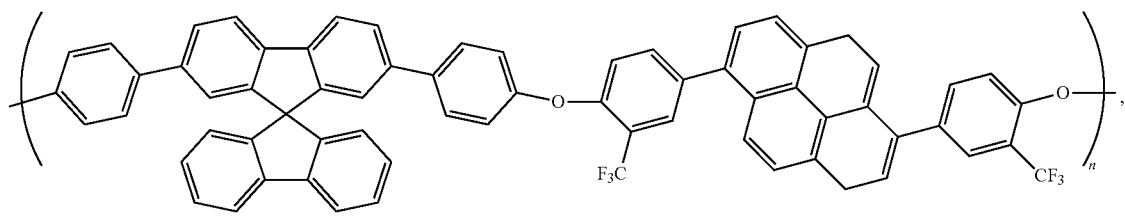, which includes the subject portion derived from pyrene with fluorine-containing substituents, and the object portion derived from fluorene, and they are connected through the ether bonds. The polymer of poly(arylene ether)s can be coated to form an thin film used as an organic light emitting layer, and applied to a polymer light emitting diode.

Another embodiment of the present invention provides a manufacturing method of the polymer of poly(arylene ether)s, comprising steps of (S01) providing a fluorine-containing monomer; (S02) providing a multi-phenyl monomer; and (S03) processing a nucleophilic polycondensation between the fluorine-containing monomer and the multi-phenyl monomer to form a polymer of poly(arylene ether)s. The principle and the implementation details of each step in this embodiment of the present invention will be described in detail hereinafter.

First, the manufacturing method of the polymer of poly(arylene ether)s according to one embodiment of the present invention is the step (S01): providing a fluorine-containing monomer. In this step, the fluorine-containing monomer can be provided with a molecular structure given in the following formula (I):

D1-Ar-D1          (I), wherein Ar is

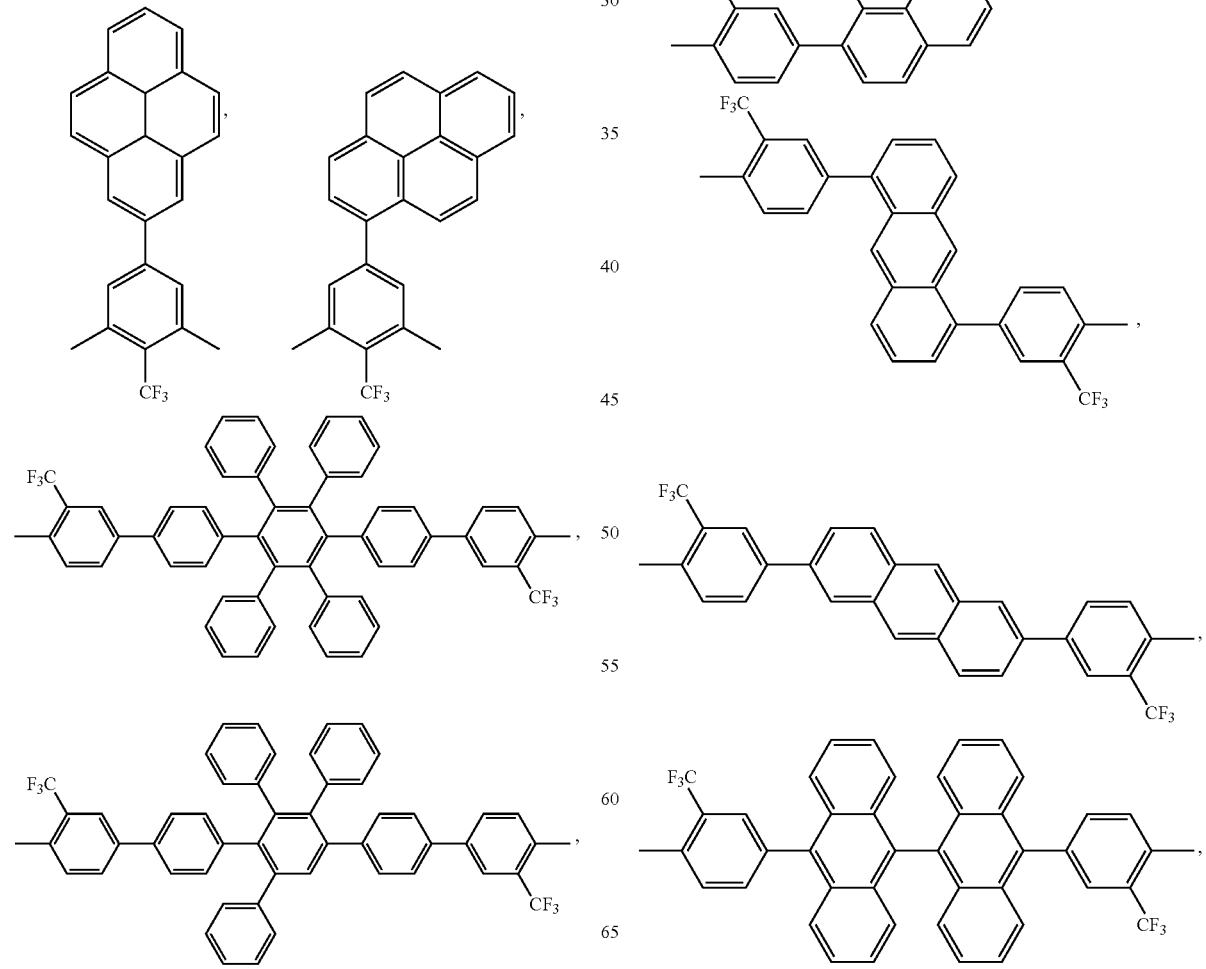

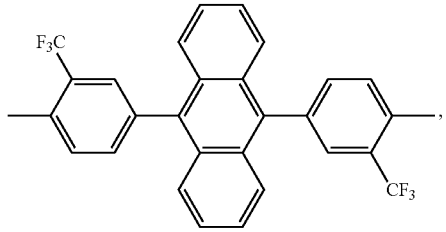,
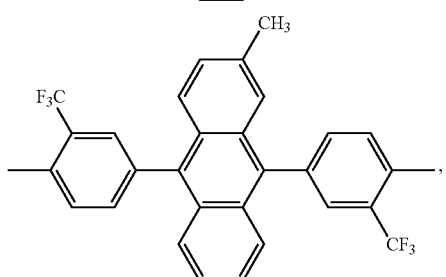,
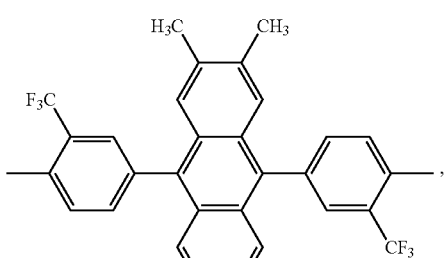,
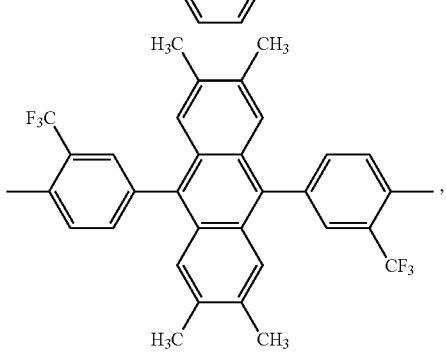,
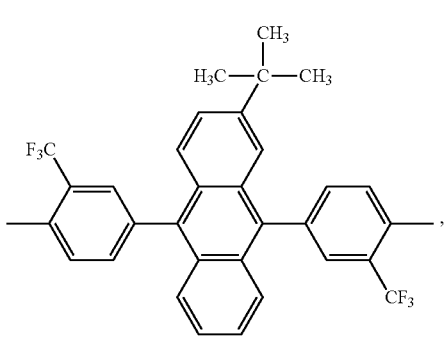,
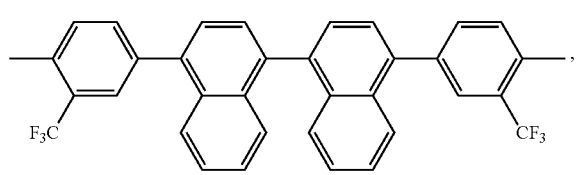,
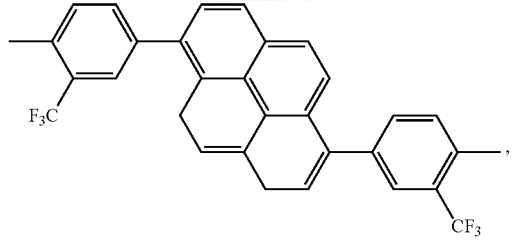,
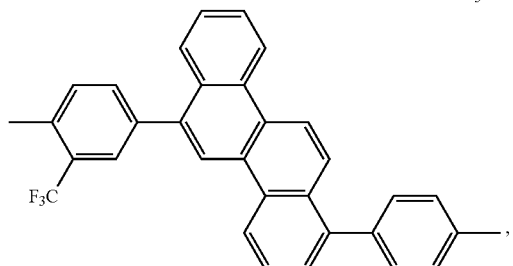,
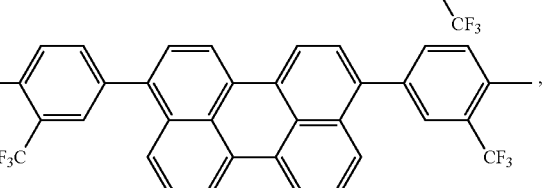,
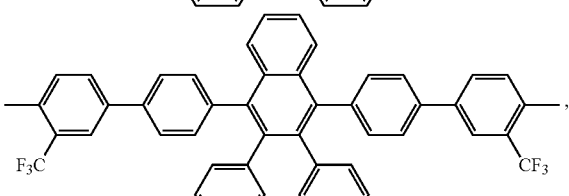,
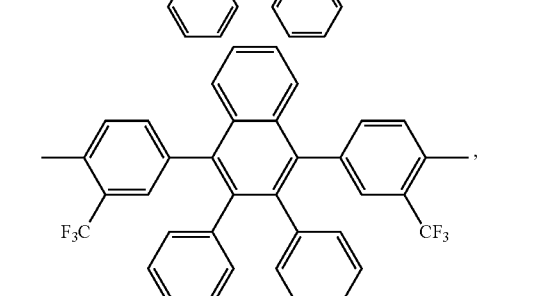
or
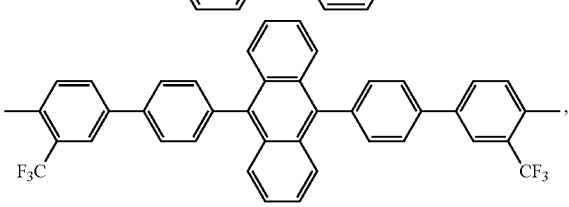,
D1 is halogen or hydroxyl group, wherein each Ar contains two bonding terminals "—" to respectively connect with the D1, thereby forming D1-Ar-D1 structured fluorine-containing monomer (formula (I)). Every bonding terminal "—" of Ar described hereinafter does not represent alkyl groups, but indicates a position for bonding the halogen or the hydroxyl group.

Furthermore, in this step, the fluorine-containing monomer can be prepared by the following steps, for example: preparing a mixing solvent of 50 mL Toluene and 50 mL tetrahydrofuran (THF) in a flask, which is purged with nitrogen gas for 20 minutes and heated to 110° C. in a sand bath; dissolving 2.30 g (8.8 mmol) 4-Bromo-2,6-difluorobenzotrifluoride and 2.4 g (9.72 mmol) Pyren-1-yl boronic acid fully in the mixing solvent to form an yellow solution; preparing 2.0 M $K_2CO_3$ aqueous which is purged with nitrogen gas and then added into the flask to mix by stirring for about 5 minutes; adding a small amount of catalyst of Tetrakis (triphenylphosphine) palladium ($Pd(PPh_3)_4$) and introducing nitrogen gas by a needle tube after installing a condenser with the flask; heating and mixing by stirring for 24 hours; turning off the heat source but keeping stirring to cool the solution down to room temperature; taking out the organic layer of the solution and removing the solvent by using a rotary evaporator; extracting with deionized water and chloroform ($CHCl_3$) to obtain an organic layer; after the organic layer is filtered by using anhydrous $MgSO_4$, the organic layer is concentrated by using the rotary evaporator; and processing a column chromatography to obtain an intermediate product 1:

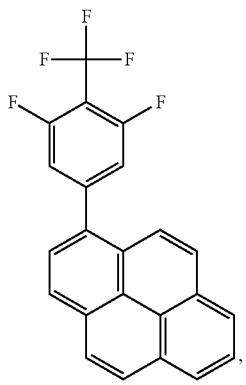

having green/gray white color and 80% yield.

Next, the manufacturing method of the polymer of poly (arylene ether)s according to one embodiment of the present invention is the step (S02): providing a multi-phenyl monomer having a molecular structure given in the following formula (II):

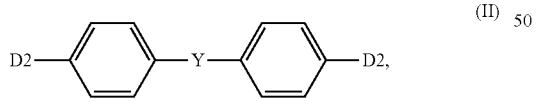
(II)

wherein Y is

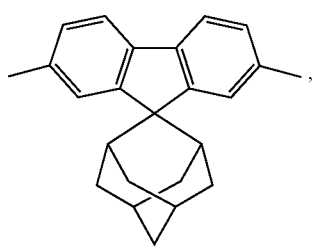

-continued

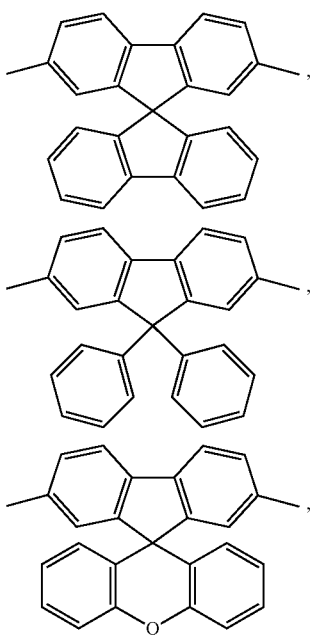

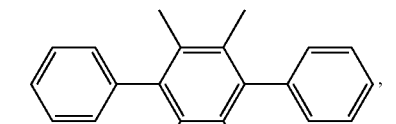

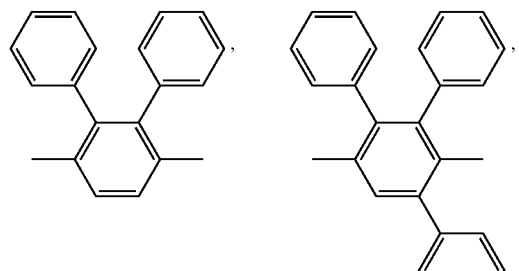

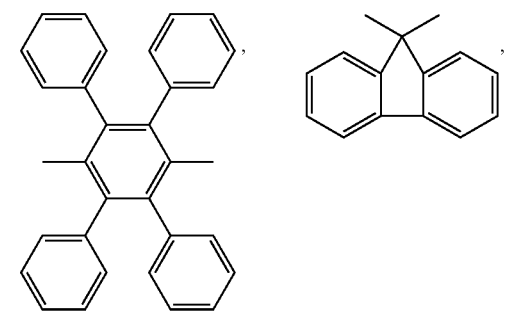

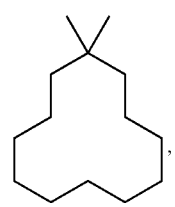

-continued

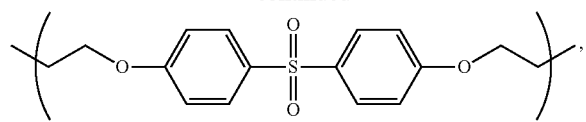

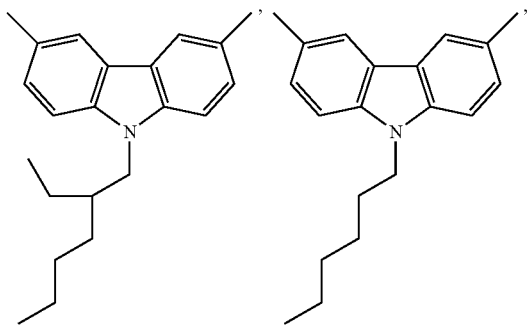

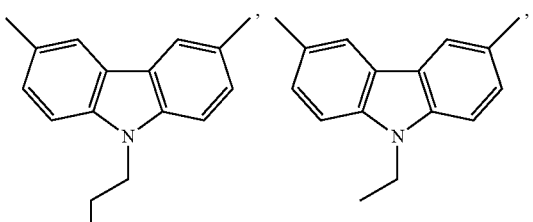

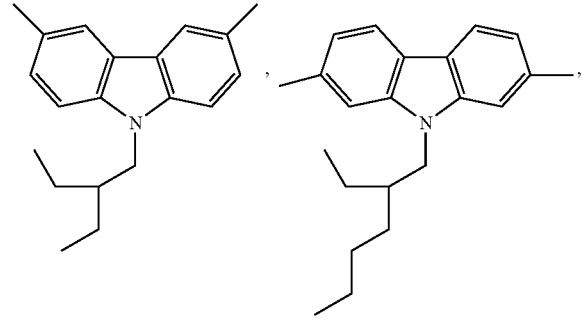

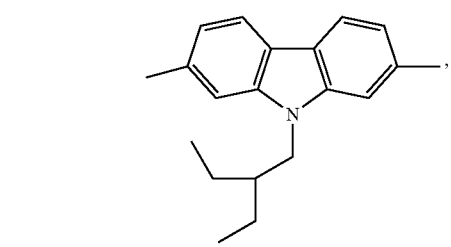

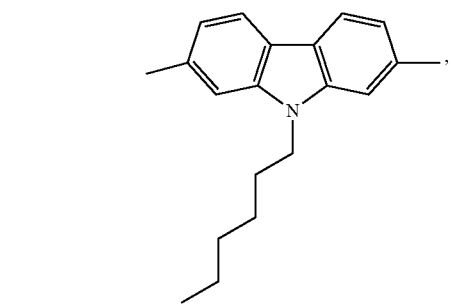

-continued

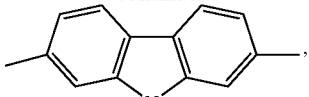

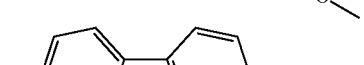

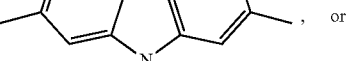

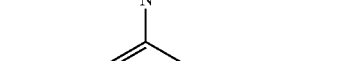

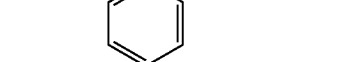

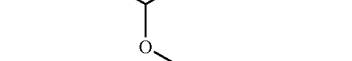

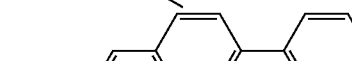

and D2 is halogen or hydroxyl group; wherein D2 is the hydroxyl group if D1 is the halogen group, or D2 is the halogen group if D1 is the hydroxyl group. Preferably, D2 can be fluoro (—F) or chloro (—Cl), but it is not limited thereto. In addition, each Y molecule includes two bonding terminals "—" to respectively connect with the D2, thereby forming D2-Y-D2 structured multi-phenyl monomer (formula (II)). Every bonding terminal "—" of Y described hereinafter does not represent alkyl groups, but indicates a position for bonding the halogen or the hydroxyl group. Regarding the last second to thirteen options of Y, the bending C2-C8 carbon chains extended from nitrogen (N) or oxygen (O) are not considered as the bonding terminals "—".

In this step, the multi-phenyl monomer can be prepared by the following steps, for example: preparing a mixing solvent of 90 ml. Toluene and 20 mL ethanol in a flask, which is purged with nitrogen gas for 20 minutes and heated to 110° C. in a sand bath; fully dissolving 2.2 g (4.6 mmol) 2,7-Dibromo-9,9'-spirobifluorene and 1.5 g (10.0 mmol) 4-methoxyphenyl boronic acid in the mixing solvent to form an yellow solution; preparing 2.0 M K$_2$CO$_3$ aqueous which is purged with nitrogen gas and then added into the flask to mix by stirring for about 5 minutes; adding a small amount of catalyst of Pd(PPh$_3$)$_4$ and introducing nitrogen gas by a needle tube after installing a condenser with the flask; heating and mixing by stirring for 24 hours; turning off the heat source but keeping stirring to cool the solution down to room temperature; taking out the organic layer of the solution and removing the solvent by using a rotary evaporator; extracting with deionized water and chloroform (CHCl$_3$) to obtain an organic layer; after the organic layer is filtered by using anhydrous MgSO$_4$, the organic layer is concentrated by using the rotary evaporator and recrystallized for several times; processing a column chromatography to obtain an intermediate product 2:

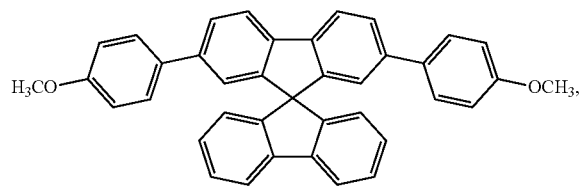 [SMILES: COc1ccc(-c2ccc3c(c2)C2(c4ccccc4-c4ccccc42)c2cc(-c4ccc(OC)cc4)ccc2-3)cc1]

having 85% yield; dissolving the intermediate product 2 in 50 mL dichloromethane (CH$_2$Cl$_2$) and adding 3 equivalent of boron tribromide (BBr$_3$) at −78° C. in an ice bath; after stirring for 1 hour, raising temperature slowly to room temperature; keeping stirring for 24 hours; after extracting directly with deionized water several times and filtering by using anhydrous MgSO$_4$, the organic layer is concentrated by using the rotary evaporator and recrystallized for several times to obtain an intermediate product 3:

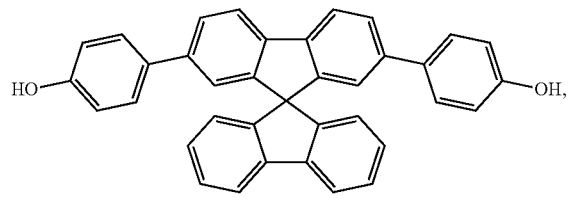 [SMILES: Oc1ccc(-c2ccc3c(c2)C2(c4ccccc4-c4ccccc42)c2cc(-c4ccc(O)cc4)ccc2-3)cc1]

having 75% yield, wherein the above-mentioned boron tribromide (BBr$_3$) may be replaced by boron trifluoride (BF$_3$) or boron trichloride (BCl$_3$).

In addition, it should be noted that the steps (S01) and (S02) of the present invention may be interchanged or carried out simultaneously.

Next, the manufacturing method of the polymer of poly (arylene ether)s according to one embodiment of the present invention is the step (S03): processing a nucleophilic polycondensation between the fluorine-containing monomer and the multi-phenyl monomer to form a polymer of poly (arylene ether)s. In this step, for example, 175 g of the intermediate product 3, 1.34 g of the intermediate 1, and 1.21 g K$_2$CO$_3$ are placed in a 50 mL of three-nacked flask, then 17 mL toluene and 27 mL N,N-Dimethylacetamide (DMAc) are added sequentially. The temperature is raised to 160° C. for carrying out the reaction for 24 hours. After that, cooling to room temperature and precipitating by using 30~50 mL THF to obtain a final product. The final product is washed with deionized water and methanol several times to obtain the polymer of poly(arylene ether)s 4:

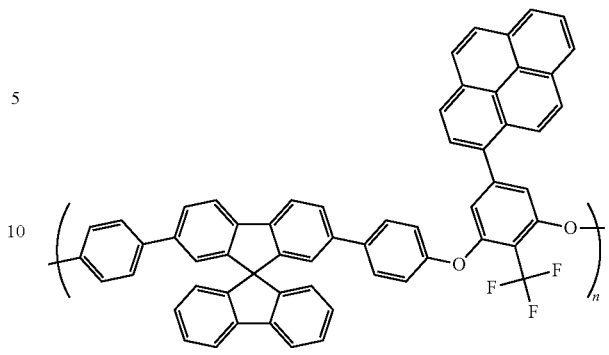

(Mw: 226500; Mn: 127000; PDI: 1.75).

Furthermore, depending on the requirements, the above-mentioned polymer of poly(arylene ether)s according to the present invention may be produced into a suitable form for standby, for example, after the step (S03), a step (S04) is further included for dissolving the polymer of poly(arylene ether)s in an organic solvent, such as chlorobenzene, o-dichlorobenzene, tetrahydrofuran, chloroform, or dimethylacetamide; and coating the polymer on a surface then forming a thin film after drying, for example, the thin film can serve as an organic light emitting layer and be applied to a polymer light emitting diode, but it is not limited thereto.

To verify the structural stability and electro-optical characteristics of the polymer of poly(arylene ether)s, the polymer of poly(arylene ether)s 4 is subject to a thermal property analysis; and a small-molecule light emitting material TPSBF (2,2',7,7'-tetra-(pyrene-1-yl)-9,9'-spirobifluorene,

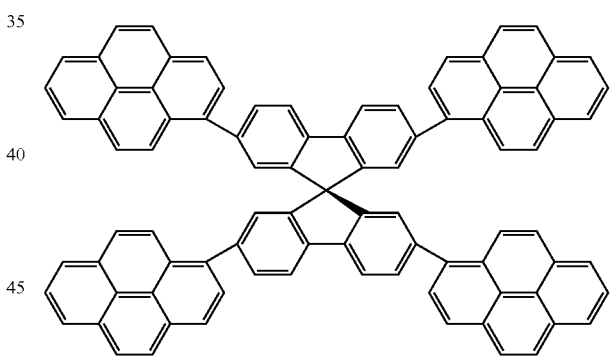

and PFO (Poly(9,9-dioctylfluorene),

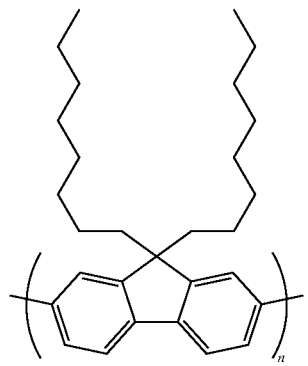

which is derived from a common blue light polymer material PDAFs (poly (9,9-dialkylfluorene)s) are used as the comparative examples to perform the electro-optical analysis.

First, the polymer of poly(arylene ether)s 4 is analyzed by using a Thermogravimetric analyzer (TGA). Under a nitrogen atmosphere, the standard pyrolysis temperature is determined by a temperature Td5% that the weight loss reaches 5% of the original weight. The material is pre-baked at 120° C. in nitrogen for 20 minutes to remove water attached thereon then cooled down to 50° C., and heated to 800° C. at a rate of 10° C./min. The pyrolysis temperature of the material is observed thereafter. After analysis, Td5% of the polymer of poly(arylene ether)s 4 is obtained, which is up to 592° C.

The electro-optical characteristics of the materials are shown in Table 1.

TABLE 1

|  | UV-vis (nm) | Photoluminescence (nm) | HOMO/ LUMO (eV) | ΔEg (eV) | CIE |
| --- | --- | --- | --- | --- | --- |
| polymer of poly(arylene ether)s4 | 342 | 408 | 5.9/2.6 | 3.3 | (0.16, 0.03) |
| TPSBF | 358 | 421 | 5.7/2.6 | 3.1 | (0.15, 0.04) |
| PFO | 376 | 426 | 5.8/2.8 | 3.0 | (0.15, 0.14) |

From Table 1, the polymer of poly(arylene ether)s 4 has a blue light coordinate approximate to TPSBF, and the light color and energy gap both comply with the standard of deep blue light material. In addition, compared with TPSBF and PFO, the polymer of poly(arylene ether)s 4 has a highest energy gap of about 3.3 eV.

Compared with the current technology, the polymer of poly(arylene ether)s has a subject portion at one side with eletron-withdrawing fluorine-containing substituents, and an object portion at another side with multi-phenyl group, which is connected with each other by an ether bond formed through a nucleophilic polycondensation, and the fluorine-containing substituents can improve the solubility in water and polymerization degree. Furthermore, the polymer of poly(arylene ether)s can be used to form a good blue light emitting material which has a flexibility like polymers and deep blue light emitting properties like small molecules. It maintains high energy gap and very available to the polymer light emitting diode.

The present invention has been described with preferred embodiments thereof and it is understood that many changes and modifications to the described embodiments can be carried out without departing from the scope and the spirit of the invention that is intended to be limited only by the appended claims.

What is claimed is:
1. A polymer of poly(arylene ether)s, having a molecular structure given in the following formula (1):

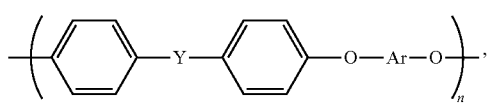

(1)

wherein Ar is selected from the group consisting of

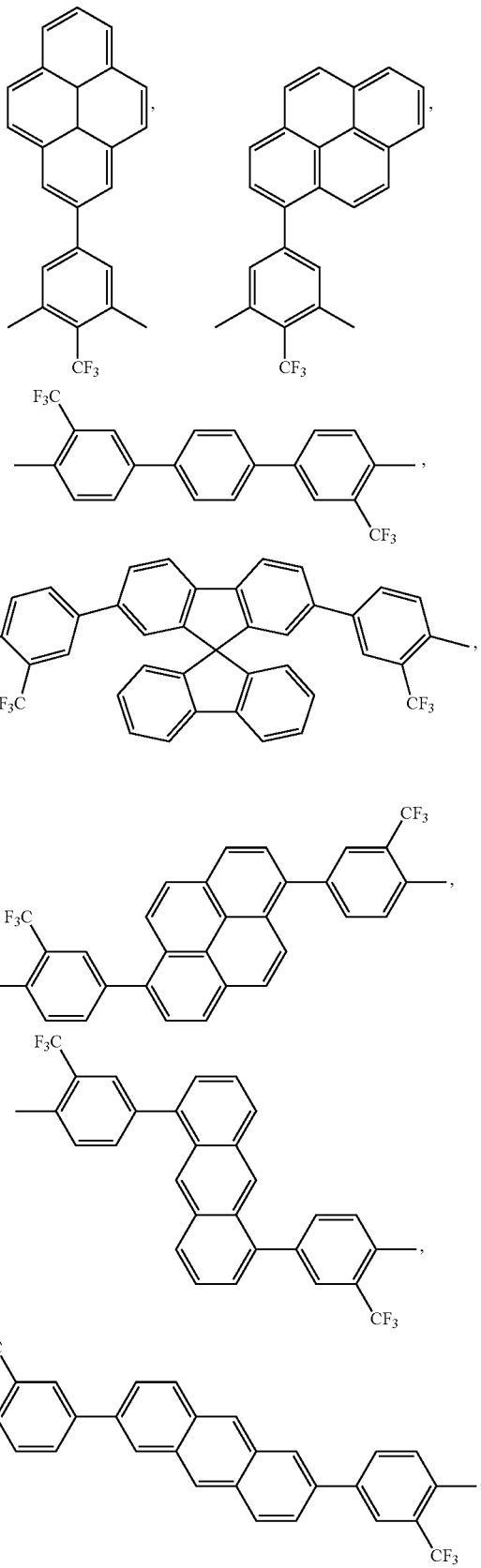

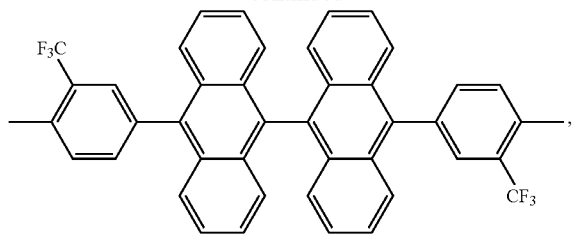
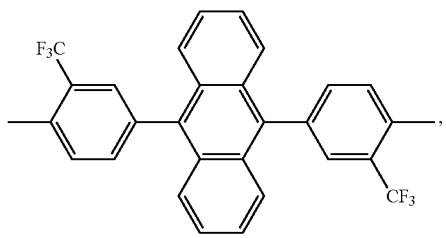
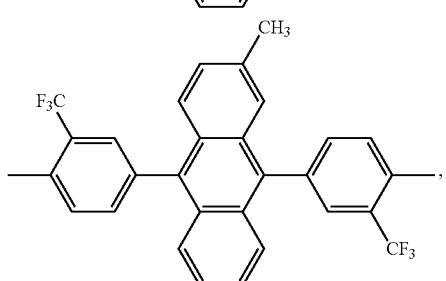
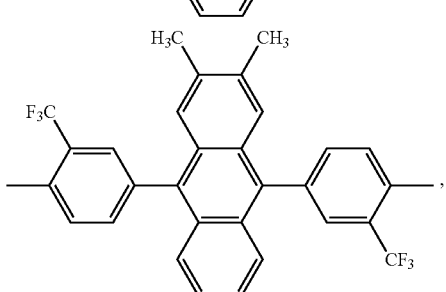
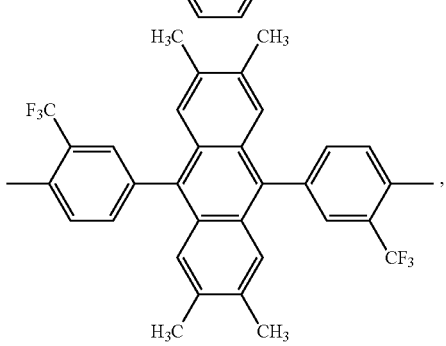
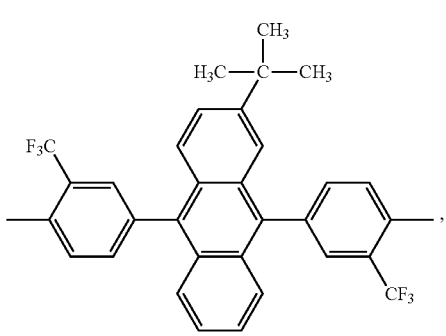
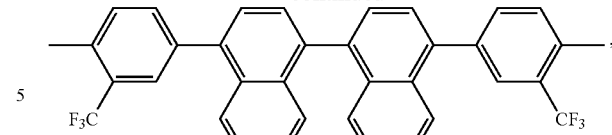
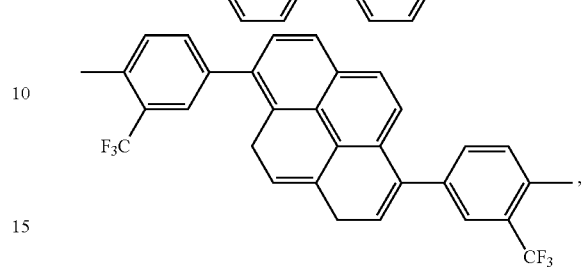
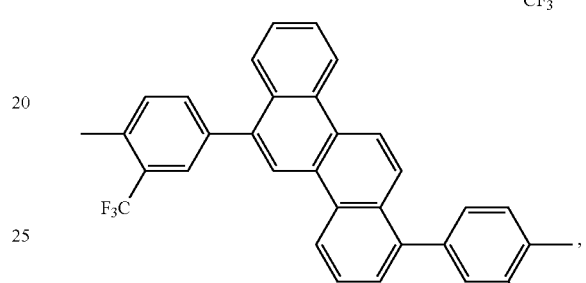
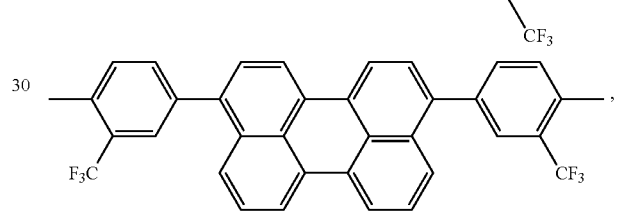
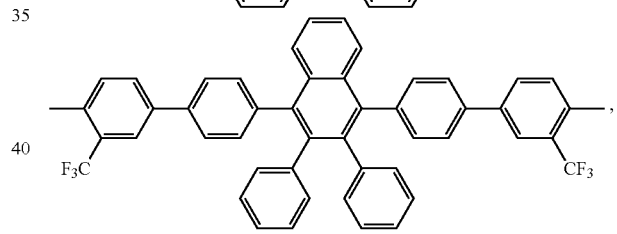
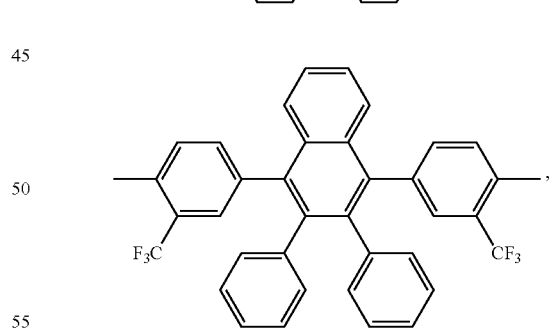
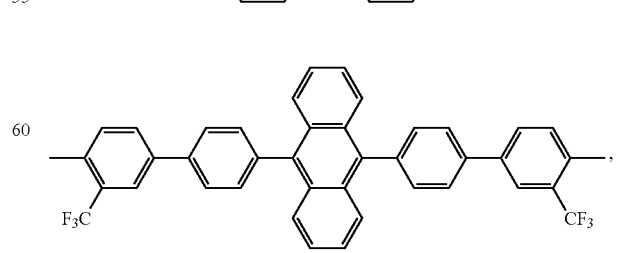
and

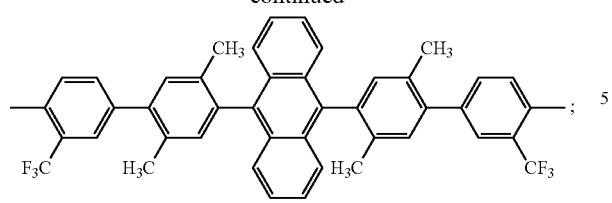
Y is selected from the group consisting of
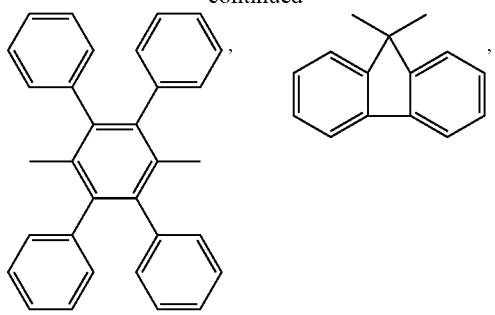
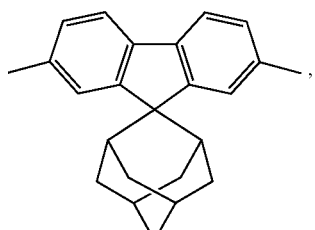
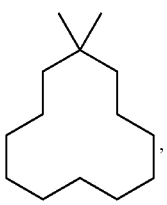
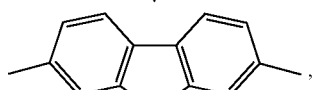
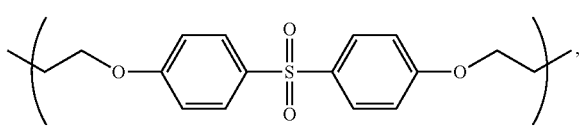
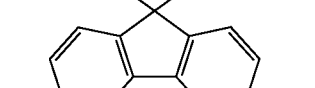
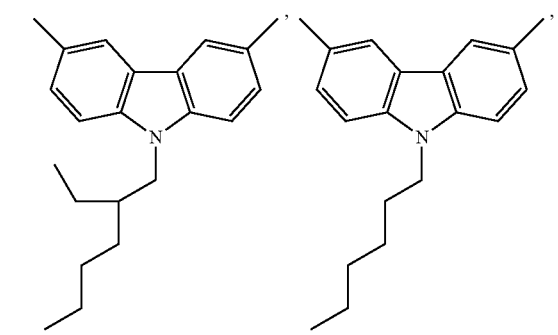
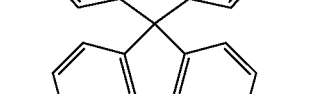
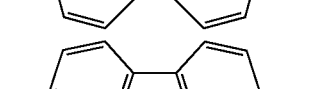
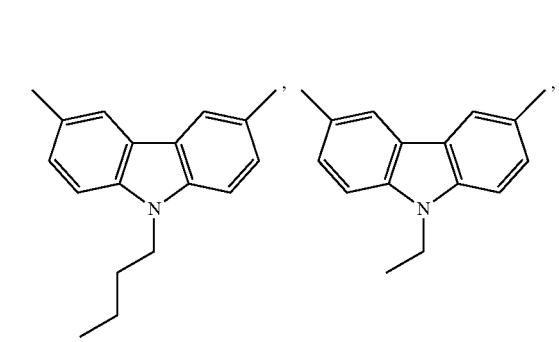
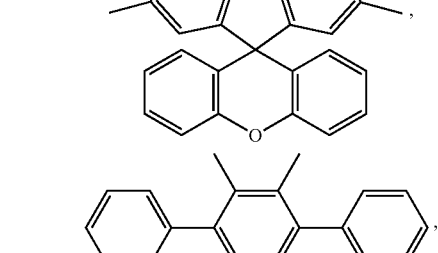
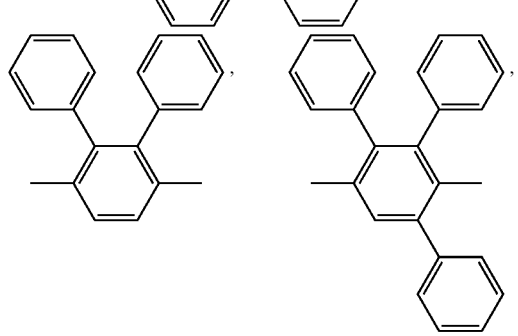
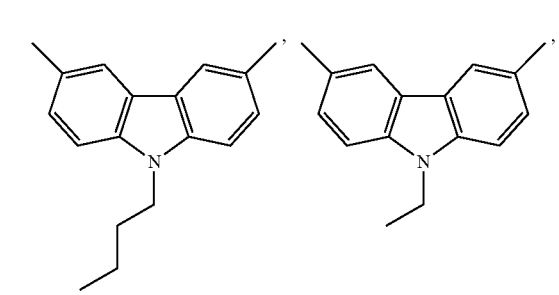
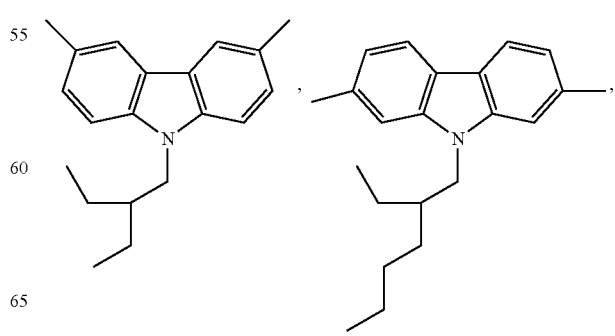

-continued
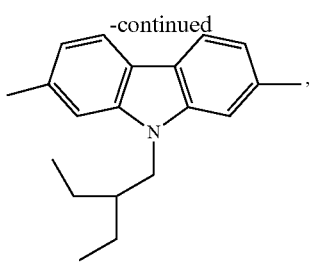
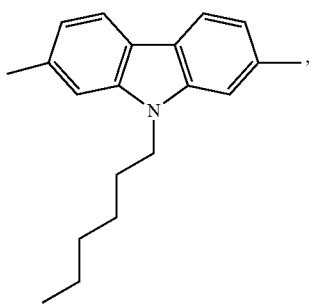
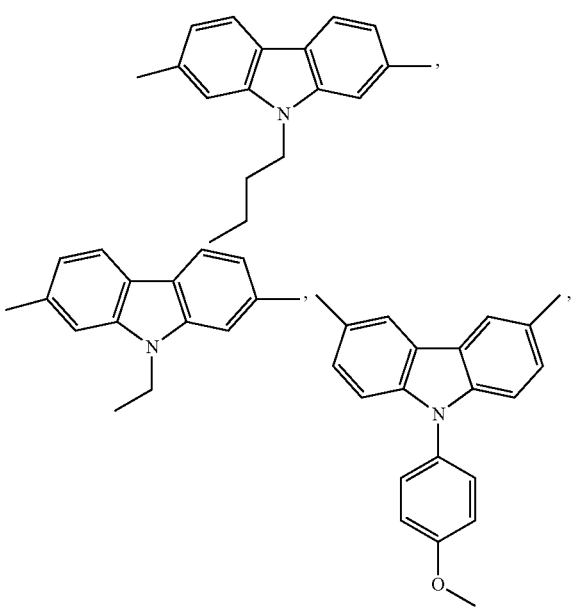
-continued
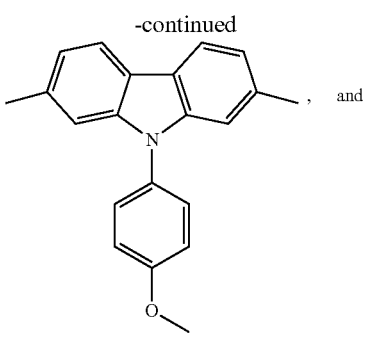
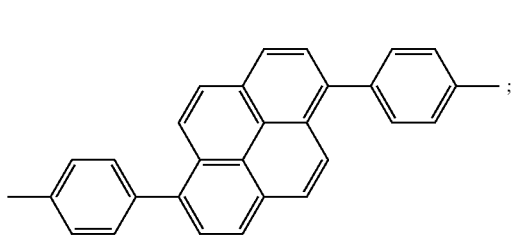
and n is an integer greater than or equal to 2.
2. The polymer of poly(arylene ether)s according to claim 1, wherein the polymer of poly(arylene ether)s is
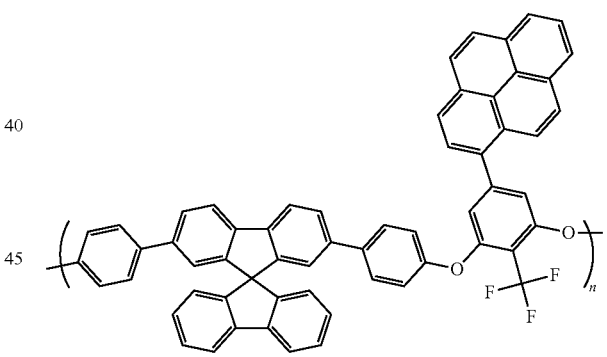
or
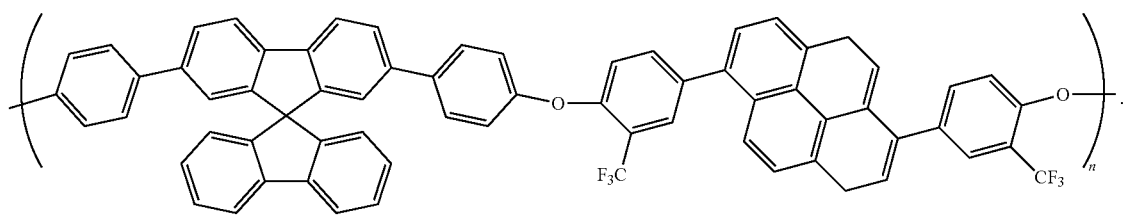

3. The polymer of poly(arylene ether)s according to claim 1, wherein the polymer of poly(arylene ether)s is coated to form a thin film used as an organic light emitting layer, and applied to a polymer light emitting diode.

4. A polymer light emitting diode, comprising an organic light emitting layer made from the polymer of poly(arylene ether)s according to claim 1.

* * * * *

UNITED STATES PATENT AND TRADEMARK OFFICE
CERTIFICATE OF CORRECTION

PATENT NO. : 9,676,906 B1  
APPLICATION NO. : 15/077928  
DATED : June 13, 2017  
INVENTOR(S) : Wen-yao Huang et al.

Page 1 of 1

It is certified that error appears in the above-identified patent and that said Letters Patent is hereby corrected as shown below:

On the Title Page

Assignee should be corrected as follows:  
Change:  
-- National Sun Yat-Sen University, Kaohsiung (TW) --  
To:  
"National Sun Yat-Sen University, Kaohsiung (TW); Wah Hong Industrial Corp., Kaohsiung (TW)"

Signed and Sealed this  
Twenty-ninth Day of August, 2017

Joseph Matal  
*Performing the Functions and Duties of the*  
*Under Secretary of Commerce for Intellectual Property and*  
*Director of the United States Patent and Trademark Office*